(12) United States Patent
Lin et al.

(10) Patent No.: US 8,193,604 B2
(45) Date of Patent: Jun. 5, 2012

(54) SEMICONDUCTOR PACKAGE WITH SEMICONDUCTOR CORE STRUCTURE AND METHOD OF FORMING THE SAME

(75) Inventors: Yaojian Lin, Singapore (SG); Jianmin Fang, Singapore (SG); Kang Chen, Singapore (SG); Haijing Cao, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/950,591

(22) Filed: Nov. 19, 2010

(65) Prior Publication Data

US 2011/0068468 A1 Mar. 24, 2011

Related U.S. Application Data

(62) Division of application No. 12/329,778, filed on Dec. 8, 2008, now Pat. No. 7,858,441.

(51) Int. Cl.
*H01L 27/08* (2006.01)

(52) U.S. Cl. ........ 257/531; 257/379; 257/380; 257/516; 257/528; 257/532; 257/536; 257/684; 257/698; 257/700

(58) Field of Classification Search .................. 257/379, 257/380, 516, 528, 531, 532, 536, 684, 698, 257/700

See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,841,193 A | 11/1998 | Eichelberger | |
| 6,495,912 B1 | 12/2002 | Huang et al. | |
| 6,828,670 B2 * | 12/2004 | Hayama et al. | 257/700 |
| 6,905,912 B2 | 6/2005 | Maeda et al. | |
| 7,214,565 B2 | 5/2007 | Sunohara | |
| 7,619,901 B2 | 11/2009 | Eichelberger et al. | |
| 7,772,081 B2 * | 8/2010 | Lin et al. | 438/393 |
| 2004/0262735 A1 | 12/2004 | Higashi et al. | |
| 2005/0130368 A1 | 6/2005 | Ooi et al. | |
| 2007/0096292 A1 * | 5/2007 | Machida | 257/700 |
| 2008/0001285 A1 | 1/2008 | Yang | |
| 2008/0099911 A1 | 5/2008 | Machida | |
| 2008/0136004 A1 | 6/2008 | Yang et al. | |
| 2009/0170242 A1 | 7/2009 | Lin et al. | |
| 2009/0294899 A1 * | 12/2009 | Pagaila et al. | 257/528 |
| 2009/0302435 A1 | 12/2009 | Pagaila et al. | |
| 2010/0006994 A1 | 1/2010 | Shim et al. | |
| 2010/0059876 A1 * | 3/2010 | Shimizu et al. | 257/700 |

* cited by examiner

*Primary Examiner* — Bac Au

(74) *Attorney, Agent, or Firm* — Robert D. Atkins; Patent Law Group: Atkins & Associates, P.C.

(57) ABSTRACT

A semiconductor device includes an IPD structure, a first semiconductor die mounted to the IPD structure with a flip-chip interconnect, and a plurality of first conductive posts that are disposed adjacent to the first semiconductor die. The semiconductor device further includes a first molding compound that is disposed over the first conductive posts and first semiconductor die, a core structure bonded to the first conductive posts over the first semiconductor die, and a plurality of conductive TSVs disposed in the core structure. The semiconductor device further includes a plurality of second conductive posts that are disposed over the core structure, a second semiconductor die mounted over the core structure, and a second molding compound disposed over the second conductive posts and the second semiconductor die. The second semiconductor die is electrically connected to the core structure.

24 Claims, 19 Drawing Sheets

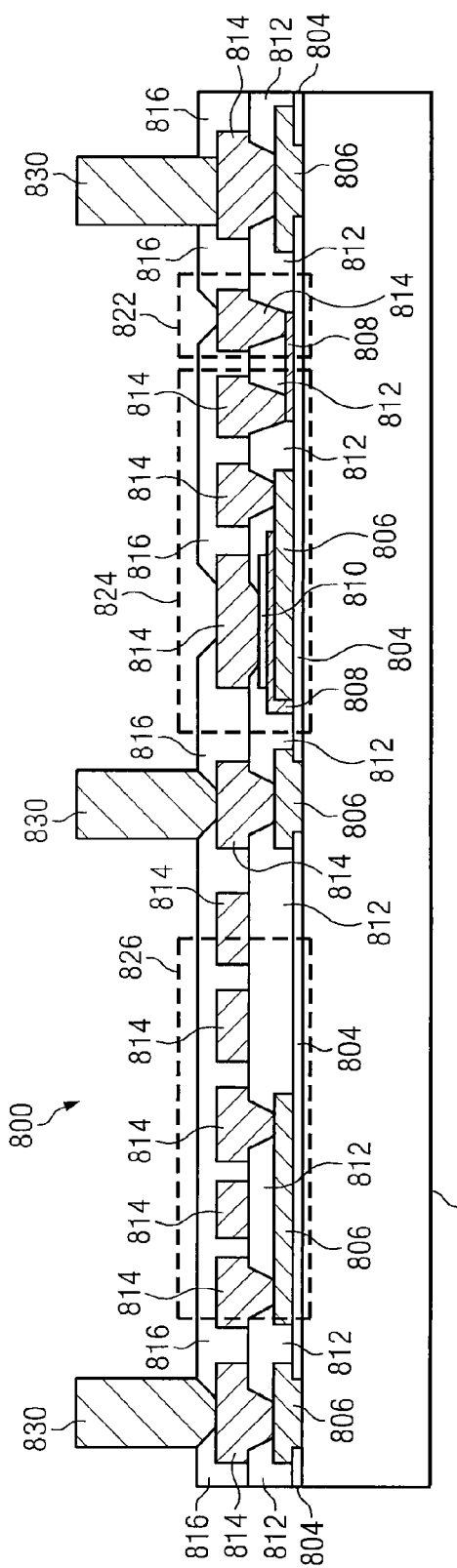
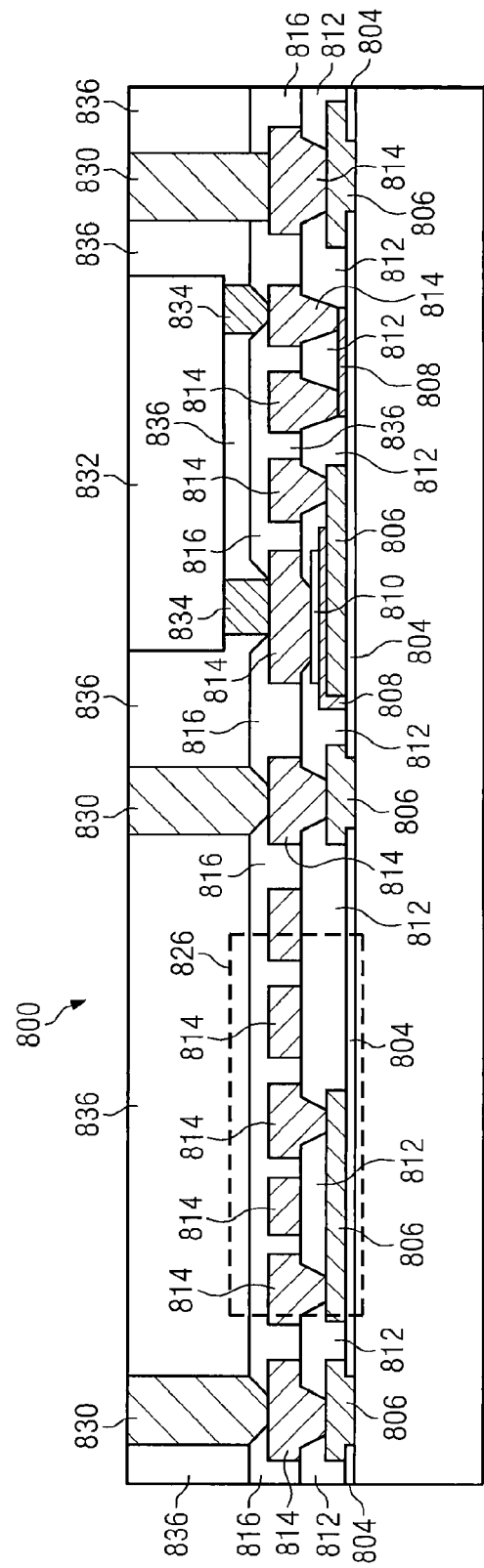
FIG. 10a
FIG. 10b

US 8,193,604 B2

SEMICONDUCTOR PACKAGE WITH SEMICONDUCTOR CORE STRUCTURE AND METHOD OF FORMING THE SAME

CLAIM TO DOMESTIC PRIORITY

The present application is a division of U.S. patent application Ser. No. 12/329,778, filed Dec. 8, 2008, and claims priority to the foregoing parent application pursuant to 35 U.S.C. §120.

FIELD OF THE INVENTION

The present invention relates in general to semiconductor devices and, more particularly, to a semiconductor device having a semiconductor core and an integrated passive device (IPD) structure formed away from the core.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In many applications, semiconductor packages combine analog and digital circuitry. To simplify fabrication, the packages are often constructed by combining an IPD structure with other circuits or packaged die to provide the necessary functionality. Generally, the IPD structure is fabricated over a high resistivity substrate. Unfortunately, the integration of the IPD structure with one or more die or chips can result in a low-reliability device. Because the coefficient of thermal expansion (CTE) of the high resistivity substrate of the IPD structure is often different from that of the integrated die or chips, the devices expand and contract at different rates as their overall temperature changes. The resulting expansion mismatch can result in damage to the internal structure of the semiconductor package causing reliability problems.

SUMMARY OF THE INVENTION

In one embodiment, the present invention is a semiconductor device comprising a temporary carrier for supporting the semiconductor device and an IPD structure disposed over the temporary carrier. The IPD structure includes an inductor, resistor, or capacitor. The semiconductor device further comprises a plurality of first conductive posts disposed over the temporary carrier, a first semiconductor die mounted to the IPD structure with a flipchip interconnect, and a first wafer molding compound deposited over the first conductive posts and the first semiconductor die. The semiconductor device further comprises a core structure bonded to the first conductive posts over the first semiconductor die, a plurality of conductive through silicon vias (TSVs) disposed in the core structure, and a first redistribution layer (RDL) disposed over the core structure. The core structure includes a silicon material. The semiconductor device further comprises a plurality of second conductive posts disposed over the core structure, a second semiconductor die mounted over the core structure with a flipchip interconnect, a second wafer molding compound deposited over the second conductive posts and the second semiconductor die, and a second RDL disposed over the second molding compound and the second semiconductor die. The second semiconductor die is electrically connected to the core structure.

In another embodiment, the present invention is a semiconductor device comprising an IPD structure, a first semiconductor die mounted to the IPD structure with a flipchip interconnect, and a plurality of first conductive posts disposed adjacent to the first semiconductor die. The semiconductor device further comprises a first molding compound disposed over the first conductive posts and first semiconductor die, a core structure bonded to the first conductive posts over the first semiconductor die, and a plurality of TSVs disposed in the core structure. The semiconductor device further comprises a plurality of second conductive posts disposed over the core structure, a second semiconductor die mounted over the core structure, and a second molding compound disposed over the second conductive posts and the second semiconductor die. The second semiconductor die is electrically connected to the core structure.

In another embodiment, the present invention is a semiconductor device comprising an IPD structure, a first semiconductor die mounted to the IPD structure, and a plurality of first conductive posts disposed over the IPD structure and outside a footprint of the first semiconductor die. The semiconductor device further comprises a first molding compound deposited over the first conductive posts, the IPD structure, and the first semiconductor die. The semiconductor device further comprises a wafer core structure bonded to the first conductive posts over the first semiconductor die. The wafer core structure has sufficient area to cover the first conductive posts and the first semiconductor die.

In another embodiment, the present invention is a semiconductor device comprising an IPD structure, a first semiconductor die mounted to the IPD structure, and a plurality of first conductive posts disposed over the IPD structure away from the first semiconductor die. The semiconductor device further comprises a core structure bonded to the first conductive posts over the first semiconductor die and a second semiconductor die mounted over the core structure. The core structure includes a semiconductor material and conductive TSVs, and the second semiconductor die is electrically connected to the core structure.

BRIEF DESCRIPTION OF THE DRAWINGS

FIGS. 10a-10e illustrate a method of forming a semiconductor package having a semiconductor core with pre-fabricated conductive TSVs;

DETAILED DESCRIPTION OF THE DRAWINGS

Figure 1:
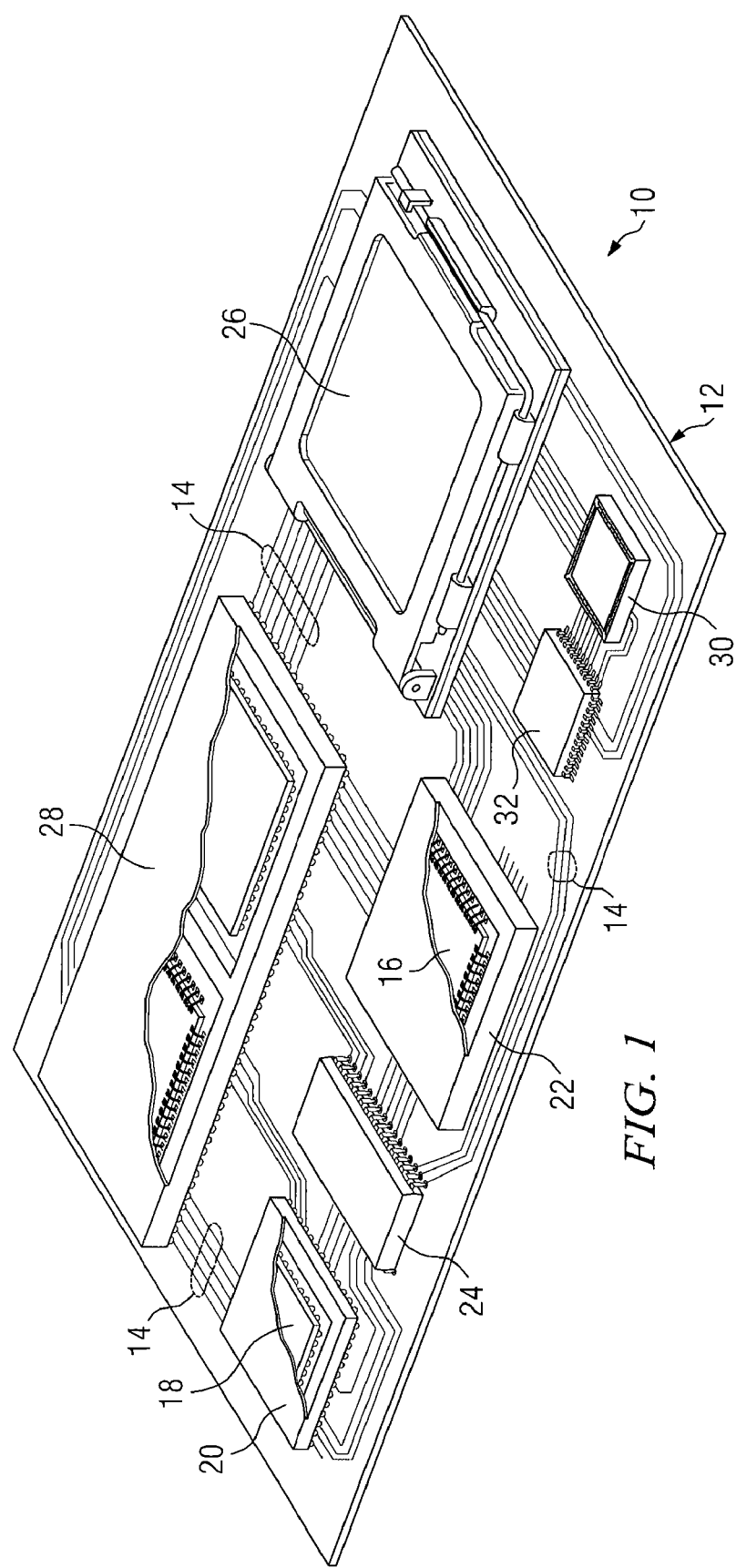
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or PCB 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is the technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and shorter manufacturing process. The resulting devices are less likely to fail and less expensive to manufacture resulting in lower costs for consumers.

Figure 2A:
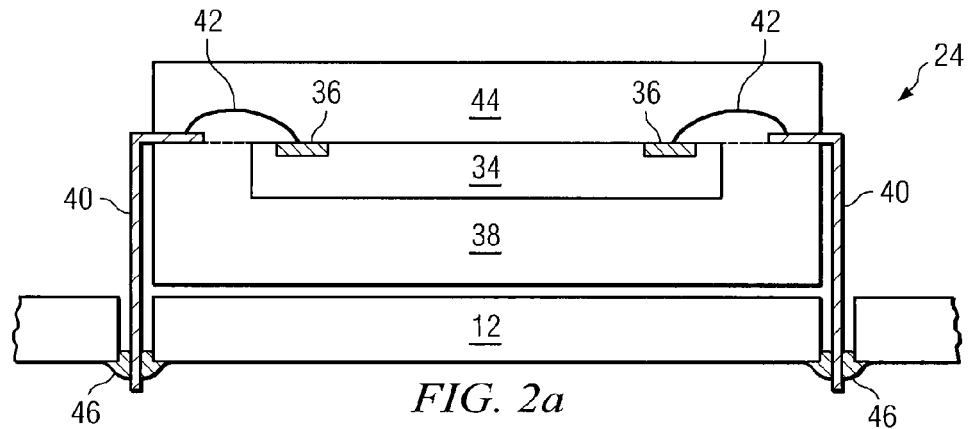
FIGS. 2a-2c illustrate further detail of the representative semiconductor packages mounted to the PCB.

FIG. 2a illustrates further detail of DIP 24 mounted PCB 12. DIP 24 includes semiconductor die 34 having contact pads 36. Semiconductor die 34 includes an active area containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active area of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
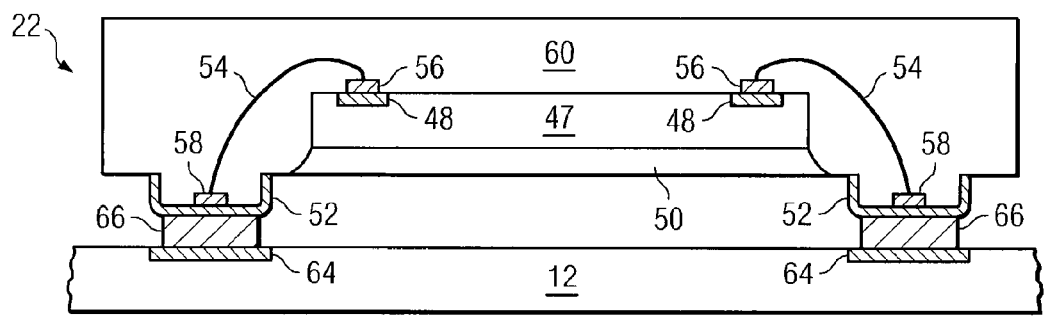

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active area containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active area of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
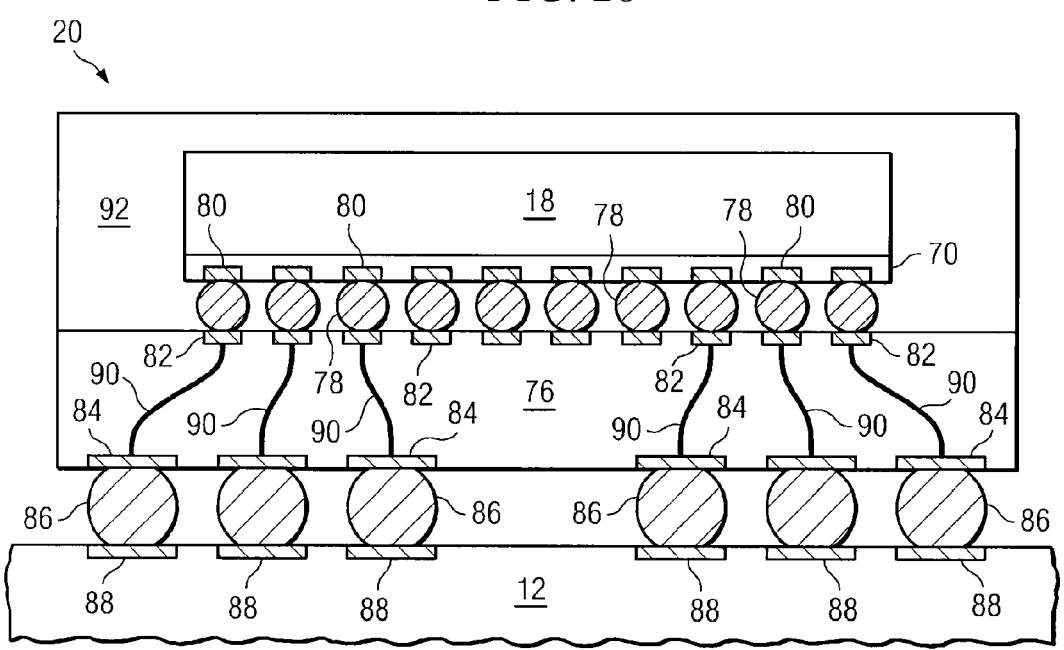

In FIG. 2c, semiconductor die 18 is mounted face down to carrier 76 with a flip chip style first level packaging. BGA 20 is attached to PCB 12 with a BGA style second level packaging. Active area 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active area 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active areas 70. Bump pads 80 are made with a conductive material, such as Al, Cu, Sn, Ni, Au, or Ag, and are electrically connected to the circuit elements formed in active area 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
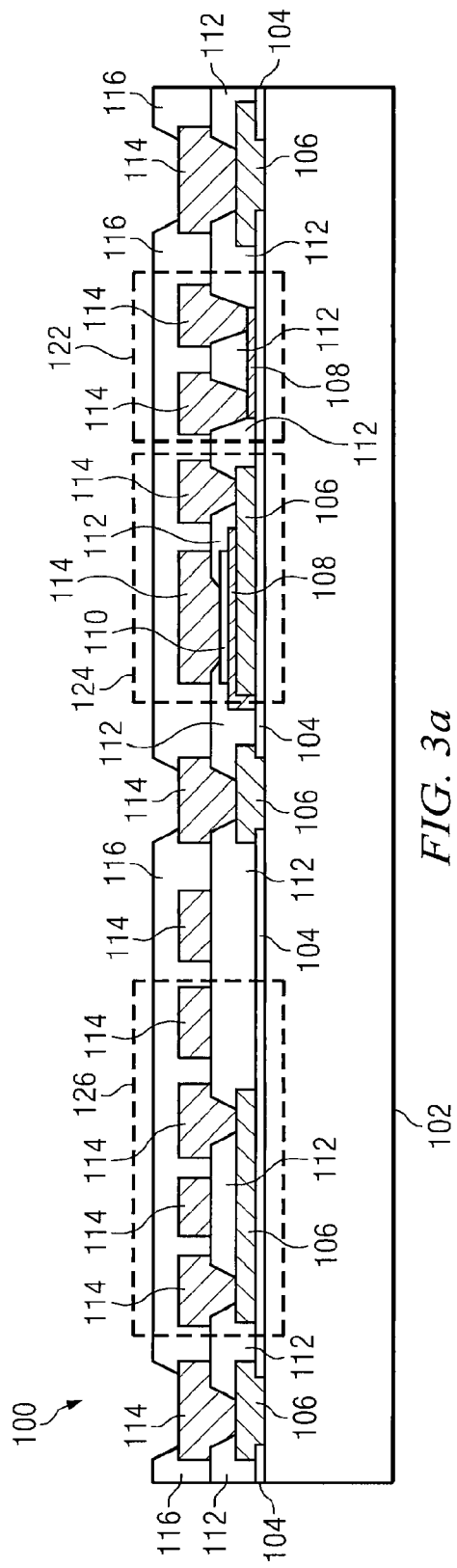
FIGS. 3a-3f illustrate a method of forming a semiconductor package over a dummy wafer.

FIGS. 3a-3f illustrate a method of forming semiconductor package 100 having a semiconductor core. As shown in FIG. 3a, a dummy wafer 102 is made with silicon (Si) or other semiconductor or rigid materials. The insulation layer 104 is optionally formed over dummy wafer 102. The insulation layer 104 is typically made with silicon dioxide (SiO2), but can also be made with silicon nitride (Si3N4), silicon oxynitride (SiON), tantalum pentoxide (Ta2O5), zircon (ZrO2), aluminum oxide (Al2O3), or other material having dielectric properties. The deposition of insulation layer 104 involves CVD, or thermal oxidation. The insulation layer 104 may be patterned before deposition of metal layer 106 or after removal of dummy wafer 102.

An IPD or passive circuit is formed over dummy wafer 102. Generally, the fabrication process is operated with peak process temperatures greater than 200 degrees Celsius (° C.), but can be lower than 200° C. The IPD circuit may include various passive devices such as capacitors, resistors, and inductors that are formed over a surface of dummy wafer 102. Metal layer 106 is deposited over insulation layer 104. Resistive layer 108 is deposited over metal layer 106 and insulation layer 104 and includes tantalum silicide (TaxSiy) or other metal silicides, TaN, nichrome (NiCr), TiN, or doped polysilicon. Dielectric layer 110 is deposited over resistive layer 108. Dielectric layer 110 can be Si3N4, Ta2O5, hafnium oxide (HfO2), or a dielectric film material. In the present embodiment, resistive layer 108, formed between dielectric layer 110 and metal layer 106, is optional. The insulation layer 112 is deposited over insulation layer 104, metal layer 106, resistive layer 108, and dielectric layer 110. Metal layer 114 includes a conductive material and is deposited over insulation layer 112 using a PVD, CVD, electrolytic plating, or electroless plating process.

The combination of metal, insulation, dielectric, and resistive layers forms one or more passive devices over a surface of dummy wafer 102. Box 122 shown on FIG. 3a indicates a resistor structure formed over dummy wafer 102 that includes portions of resistive layer 108 and metal layer 114. Box 124 indicates a capacitor structure formed over dummy wafer 102 that includes portions of metal layer 106, resistive layer 108, dielectric layer 110, and metal layer 114. Portions of metal layers 106 and 114 form the electrodes of the capacitor indicated by box 124. Box 126 indicates an inductor structure formed over dummy wafer 102 that includes portions of metal layer 114. In alternative embodiments, different combinations of passive devices, RF circuitry, or other electronic circuits are formed over dummy wafer 102 to provide the necessary functionality of semiconductor package 100. During the fabrication process, the IPD devices may be tested at wafer level to improve the yield of semiconductor package 100. The insulation or passivation layer 116 is optionally deposited over dummy wafer 102 to provide electrical isolation and physical protection to semiconductor package 100. The insulation layer 116 is patterned to expose portions of metal layer 114.

Figure 3B:
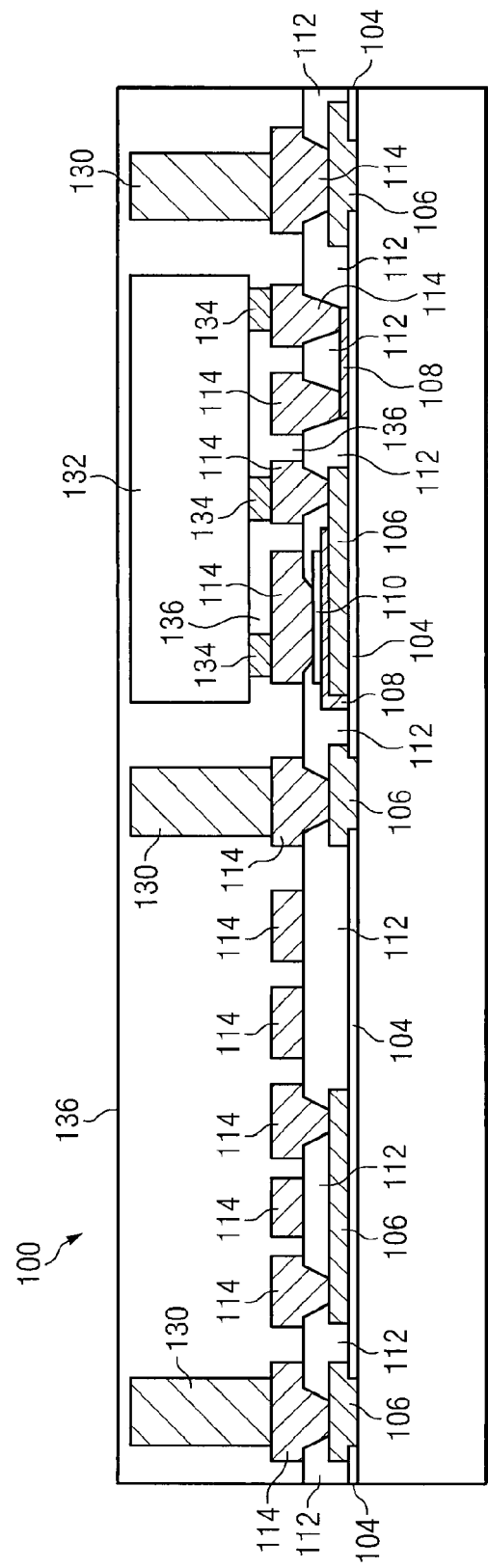

Turning to FIG. 3b, metal posts 130 are formed over semiconductor package 100 and are electrically connected to metal layer 114. Metal posts 130 may be formed using a selective plating process and may include conductive materials. Alternatively, metal posts 130 may be formed as stud bonded Al or Au bumps, or solder balls. Die 132 is mounted to metal layer 114 using conductive interconnects 134 such as metal bumps, conductive adhesive, conductive studs, or wirebonds. The height of a top surface of die 132 after mounting may be higher or lower than the height of a top surface of metal posts 130. Wafer level molding compound 136 is deposited over semiconductor package 100 and around metal posts 130 and die 132. Molding compound 136 includes a high resistivity material with a low loss tangent and matched CTE such as polymer (resin) matrix composite with fillers to adjust its mechanical, thermal, and electrical properties. For example, the loss tangent is less than 0.01 at RF frequency. Alternatively, molding compound 136 may be vacuum laminated LCP (liquid crystal polymer). Wafer molding compound 136 is optionally grinded or etched to a desired thickness. Depending upon the application, after grinding of wafer molding compound 136, a top surface of metal posts 130 and top surface of die 132 may be exposed.

Figure 3C:
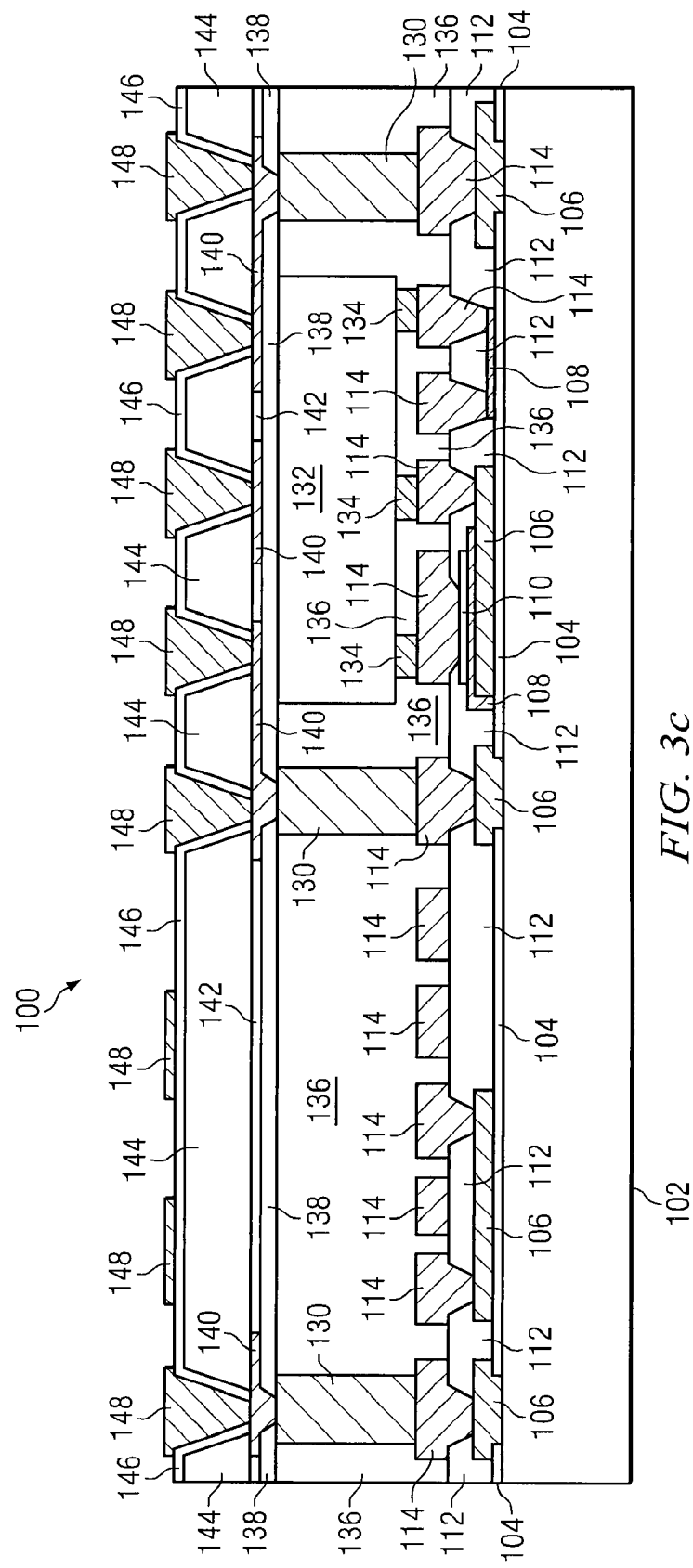

Turning to FIG. 3c, optional insulation layer 138 is deposited over molding compound 136 and patterned to expose metal posts 130. Optional metal layer 140 is deposited over the patterned regions of insulation layer 138 and is electrically connected to metal posts 130. Bonding layer 142 with insulation properties is deposited over metal layer 140 and insulation layer 138. Bonding layer 142 may be applied by spin coating, lamination, or printing. Core wafer 144 is mounted to bonding layer 142. Core wafer 144 may include silicon or other semiconductor material. Depending upon application requirements, core 144 is background to a desired thickness. Generally, core 144 is background to a thickness 50-500 micrometers (μm). In one embodiment, the thickness of core 144 after backgrinding is between 50-200 μm. TSVs are formed in core 144 using a laser drilling, DRIE etching, or other etching process with typically IR alignment. The TSVs penetrate through core 144 and also etch portions of bonding layer 142 to expose metal layer 140 or metal post 130. The insulation layer 146 is formed over core 144. As shown on FIG. 3c, insulation layer 146 may be formed as a conformal surface over core 144. Metal layer 148 is deposited over core 144 and into the TSVs. Metal layer 148 may be deposited conformally and fills the TSVs. An optional RDL may be formed over a surface of core 144.

Figure 3D:
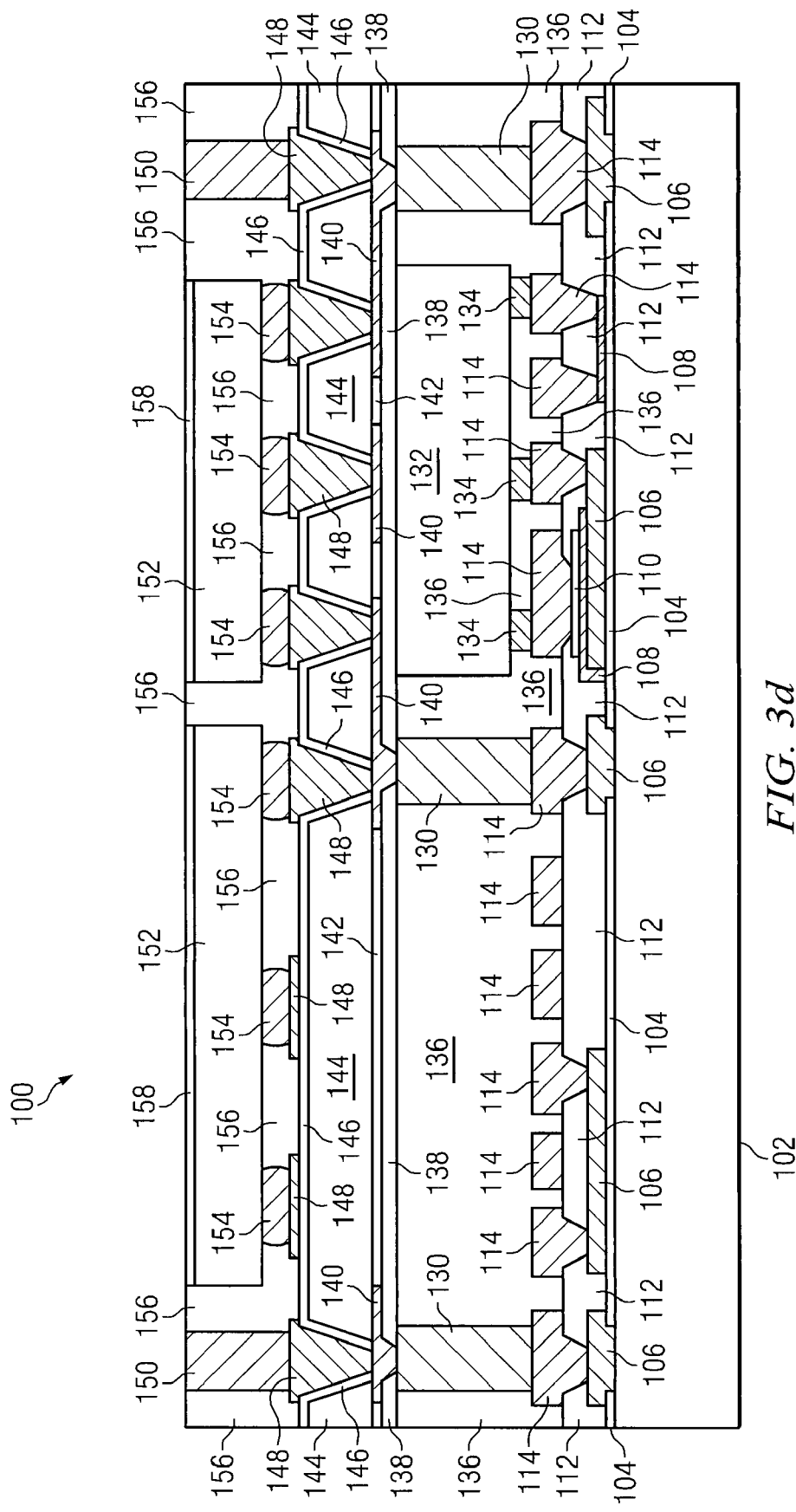

Turning to FIG. 3d, metal posts 150 are formed over core wafer 144 and are electrically connected to metal layer 148. Metal posts 150 may be formed using a selective plating process. Alternatively, metal posts 150 may be formed as stud bonded Al or Au bumps, or solder balls. Die 152 are mounted to metal layer 148 using conductive interconnects 154 such as solder bumps, conductive adhesive, conductive studs, or wirebonds. The height of a top surface of die 152 after mounting may be higher or lower than the height of a top surface of metal posts 150. Wafer level molding compound or lamination 156 is deposited over core 144 and around metal posts 150 and die 152. Molding compound 156 may optionally include a high resistivity material with a low loss tangent and matched CTE such as polymer (resin) matrix composite with fillers to adjust its mechanical, thermal, and electrical properties. Depending upon the application, wafer molding compound 156 may optionally include a low loss tangent material. Wafer molding compound 156 is optionally grinded or etched to a desired thickness. Alternatively, molding compound 156 can be lamination LCP material. Depending upon the application, after grinding of wafer molding compound 156, a top surface of metal posts 150 and top surfaces of die 152 may be exposed. Die 152 may include an optional backside compliant or insulation layer 158 and have a total thickness less than or equal to the height of metal posts 150. At this point, an optional heat sink structure may be mounted over wafer molding compound 156 in contact with die 152. The optional heat sink structure may be mounted with a heat sink adhesive material and facilitates the removal of heat energy from die 152.

Figure 3E:
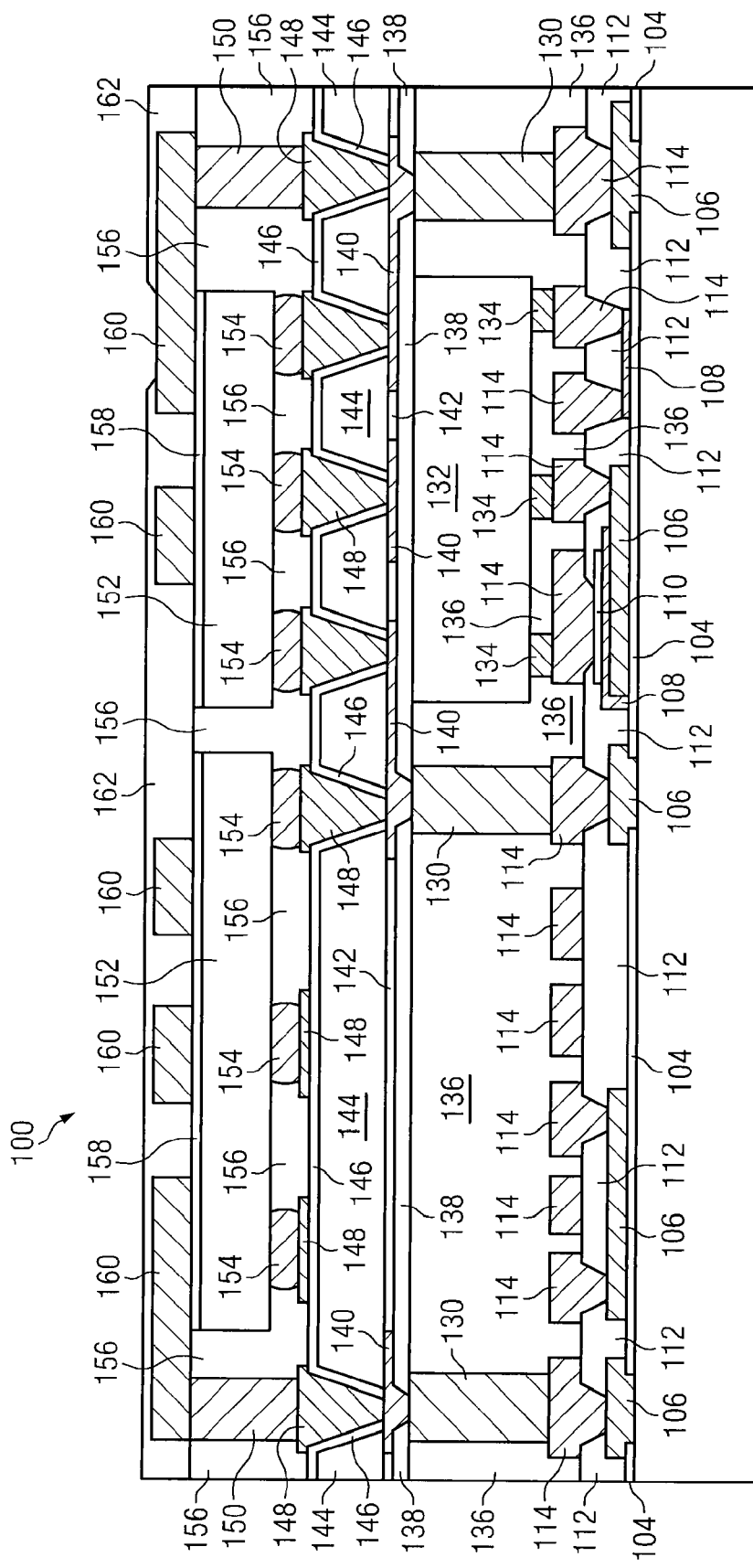

Turning to FIG. 3e, an optional interconnect structure is formed over metal posts 150 and die 152 for in-package interconnection and next-level interconnection. Metal layer 160 is deposited and patterned over metal posts 150 and die 152. The insulation layer 162 is deposited over metal layer 160. The insulation layer 162 may be patterned to expose portions of metal layer 160.

Figure 3F:
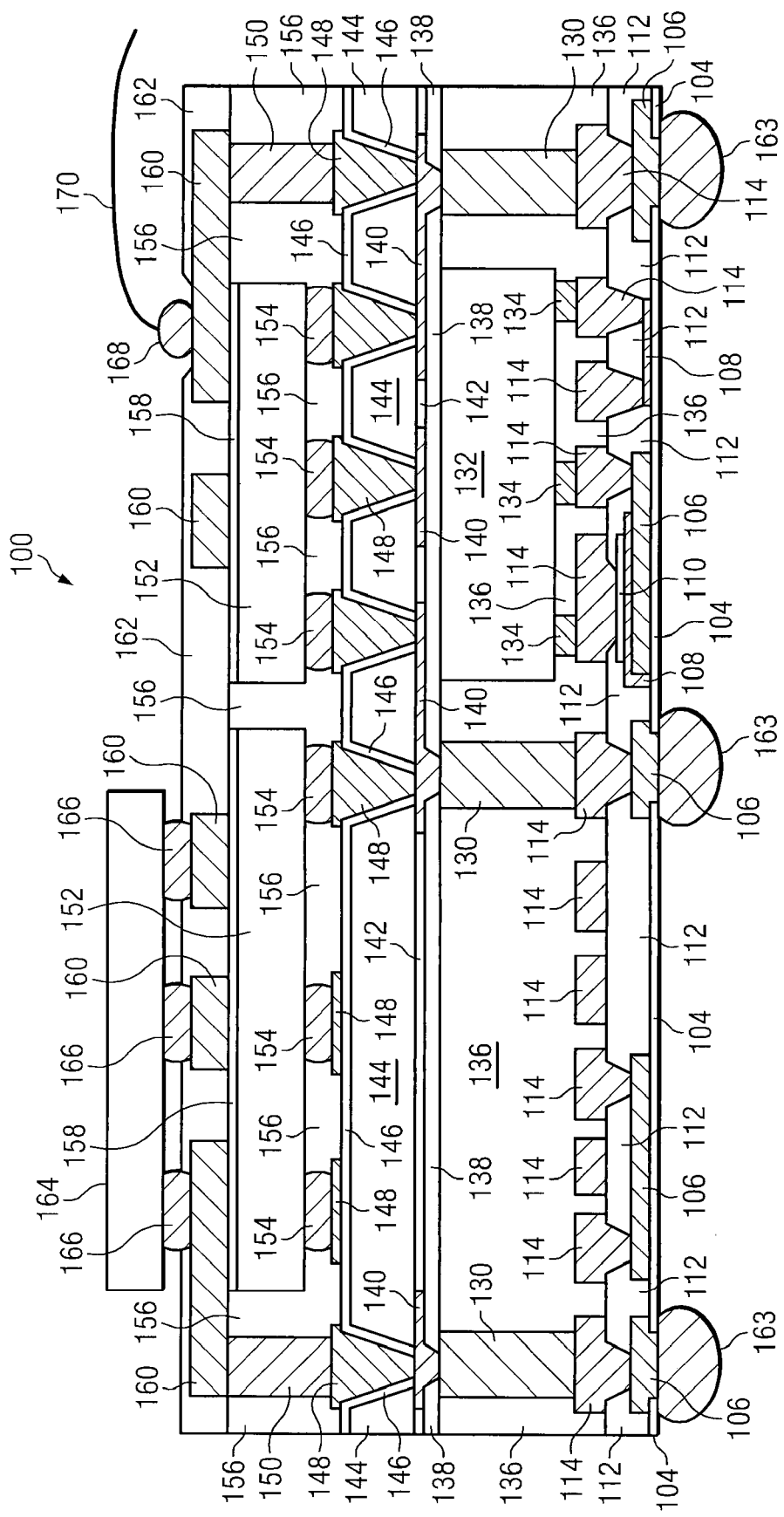

Turning to FIG. 3f, dummy wafer 102 is removed using backgrinding and wet etching, CMP, plasma etching, thermal, light releasing process, or another etching process. Solder material is deposited over metal layer 106 and reflowed to form solder bumps 163. Additional optional interconnect structures or external devices are connected to a top surface of package 100. Die 164 is connected to metal layer 160 using electrical interconnects 166. Free-air ball 168 of wirebond 170 is reflowed and connected to metal layer 160. Semiconductor package 100 is singulated to form a plurality of separate semiconductor packages.

Using the present method, a semiconductor package is fabricated with a semiconductor core structure. The package includes an IPD structure built on a low-cost dummy Si or glass wafer, or recycled wafer. As described, the inductor portion of the IPD structure is formed away from the lossy, core structure by a high resistivity and low-loss tangent molding compound. In one embodiment, the distance between the inductor structure and the core structure is at least 50 μm. Die embedded within the package are connected to the core structure to minimize CTE mismatch forces generated within the semiconductor package. The core structure is located in a central region of the semiconductor package to further minimize warpage of the wafer and final package. The core structure also provides enhanced thermal conductivity for improved heat dissipation from the package.

Figure 4:
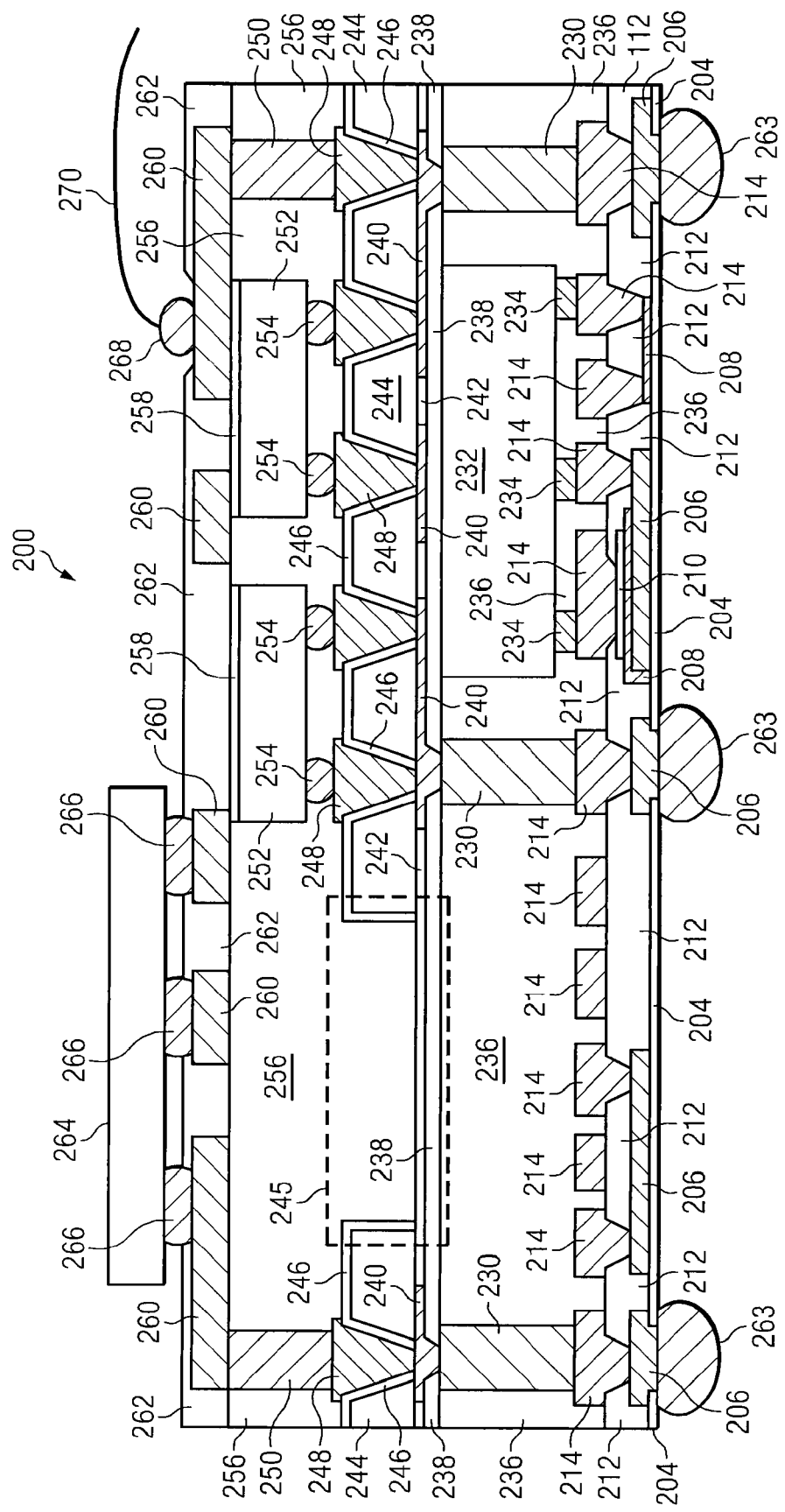
FIG. 4 illustrates a semiconductor package including a core structure and cavity formed over the inductor portion of an IPD structure.

FIG. 4 illustrates semiconductor package 200 including a core structure and cavity formed over the inductor portion of the IPD structure. Semiconductor package 200 includes insulation layer 204. The deposition of insulation layer 204 involves CVD or thermal oxidation. The insulation layer 204 may be patterned before deposition of metal layer 206.

An IPD circuit is formed using a fabrication process operated with peak process temperatures greater than 200° C. The IPD circuit may include various passive devices such as capacitors, resistors, and inductors. Metal layer 206 is deposited over insulation layer 204. Resistive layer 208 is deposited over metal layer 206 and insulation layer 204 and includes TaxSiy or other metal silicides, TaN, NiCr, TiN, or doped polysilicon. Dielectric layer 210 is deposited over resistive layer 208. Dielectric layer 210 can be Si3N4, Ta2O5, HfO2, or a dielectric film material. In the present embodiment, resistive layer 208, formed between dielectric layer 210 and metal layer 206, is optional. The insulation layer 212 is deposited over insulation layer 204, metal layer 206, resistive layer 208, and dielectric layer 210. Metal layer 214 includes a conductive material and is deposited over insulation layer 212 using a PVD, CVD, electrolytic plating, or electroless plating process.

Metal posts 230 are formed over semiconductor package 200 and are electrically connected to metal layer 214. Metal posts 230 may be formed using a selective plating process. Die 232 is mounted to metal layer 214 using conductive interconnects 234 such as solder bumps, conductive adhesive, conductive studs, or wirebonds. The height of a top surface of die 232 after mounting may be higher or lower than the height of a top surface of metal posts 230. Wafer level molding compound 236 is deposited over semiconductor package 200 and around metal posts 230 and die 232. Molding compound 236 includes a high resistivity material with a low loss tangent and matched CTE such as polymer (resin) matrix composite with fillers to adjust its mechanical, thermal, and electrical properties. Wafer molding compound 236 is optionally grinded or etched to a desired thickness. Depending upon the application, after grinding of wafer molding compound 236, a top surface of metal posts 230 and top surface of die 232 may be exposed.

The insulation layer 238 is deposited over molding compound 236 and patterned to expose metal posts 230. Metal layer 240 is deposited over the patterned regions of insulation layer 238 and is electrically connected to metal posts 230. Bonding layer 242 is deposited over metal layer 240 and insulation layer 238. Bonding layer 242 may include an adhesive die-attach material. Core 244 is mounted to bonding layer 242. Core 244 may include silicon or other semiconductor material. Depending upon application requirements, core 244 is background to a desired thickness. Generally, core 244 is background to a thickness between 50-500 µm. In one embodiment, the thickness of core 244 after backgrinding is between 50-200 µm. TSVs are formed in core 244 using a laser drilling, laser etching, or other etching process. The TSVs penetrate through core 244 and also etch portions of bonding layer 242 to expose metal layer 240. With reference to FIG. 4, core 244 is further etched to form cavity 245. Cavity 245 minimizes the volume of core 244 disposed over the inductor portion of metal layer 214. The insulation layer 246 is formed over core 244. Metal layer 248 is deposited over core 244 and into the TSVs. Metal layer 248 may be deposited conformally and fills the TSVs. An optional RDL may be formed over a surface of core 244.

Metal posts 250 are formed over core 244 and are electrically connected to metal layer 248. Metal posts 250 may be formed using a selective plating process. Die 252 are mounted to metal layer 248 using conductive interconnects 254 such as solder bumps, conductive adhesive, conductive studs, or wirebonds. The height of a top surface of die 252 after mounting may be higher or lower than the height of a top surface of metal posts 250. Wafer level molding compound 256 is deposited over core 244, into cavity 245 and around metal posts 250 and die 252. Molding compound 256 may optionally include a high resistivity material with a low loss tangent and matched CTE. Depending upon the application, wafer molding compound 256 may optionally include a low loss tangent material. Wafer molding compound 256 is optionally grinded or etched to a desired thickness. Die 252 may include an optional backside compliant layer 258 and have a total thickness less than or equal to the height of metal posts 250.

An optional interconnect structure is formed over metal posts 250 and die 252 for in-package interconnection and next-level interconnection. Metal layer 260 is deposited and patterned over metal posts 250 and die 252. The insulation layer 262 is deposited over metal layer 260. The insulation layer 262 may be patterned to expose portions of metal layer 260.

Solder material is deposited over metal layer 206 and reflowed to form solder bumps 263. Additional optional interconnect structure or external devices are connected to a top surface of semiconductor package 200. Die 264 is connected to metal layer 260 using electrical interconnects 266. Free-air ball 268 of wirebond 270 is reflowed and connected to metal layer 260. Semiconductor package 200 is singulated to form a plurality of separate semiconductor packages.

Figure 5:
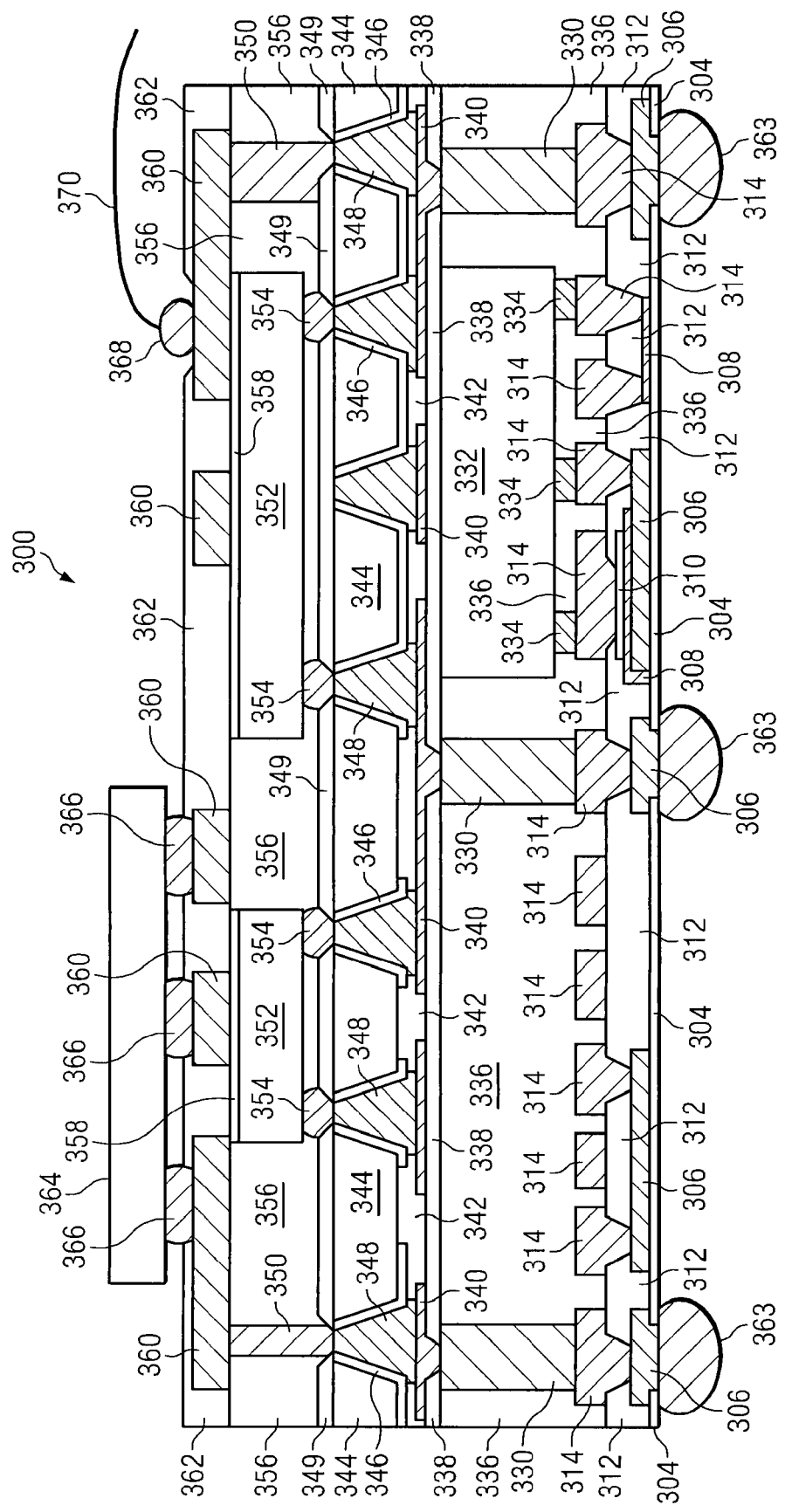
FIG. 5 illustrates a semiconductor package including a core structure with a plurality of pre-fabricated TSVs.

FIG. 5 illustrates semiconductor package 300 including a core structure having pre-fabricated TSVs. Semiconductor package 300 includes insulation layer 304. An IPD circuit is formed over insulation layer 304 using a fabrication process operated with peak process temperatures greater than 200° C. Metal layer 306 is deposited over insulation layer 304. Resistive layer 308 is deposited over metal layer 306 and insulation layer 304. Dielectric layer 310 is deposited over resistive layer 308. In the present embodiment, resistive layer 308, formed between dielectric layer 310 and metal layer 306, is optional. The insulation layer 312 is deposited over insulation layer 304, metal layer 306, resistive layer 308, and dielectric layer 310. Metal layer 314 includes a conductive material and is deposited over insulation layer 312.

Metal posts 330 are formed over semiconductor package 300 and are electrically connected to metal layer 314. Die 332 is mounted to metal layer 314 using conductive interconnects 334 such as solder bumps, conductive adhesive, conductive studs, or wirebonds. The height of a top surface of die 332 after mounting may be higher or lower than the height of a top surface of metal posts 330. Wafer level molding compound 336 is deposited over semiconductor package 300 and around metal posts 330 and die 332. Molding compound 336 includes a high resistivity material with a low loss tangent and matched CTE. Wafer molding compound 336 is optionally grinded or etched to a desired thickness. Depending upon the application, after grinding of wafer molding compound 336, a top surface of metal posts 330 and top surface of die 332 may be exposed.

The insulation layer 338 is deposited over molding compound 336 and patterned to expose metal posts 330. Metal layer 340 is deposited over the patterned regions of layer 338 and is electrically connected to metal posts 330. Bonding layer 342 is deposited over metal layer 340 and insulation layer 338. Core 344 is mounted to metal layer 348 and optional insulation bonding layer 342. The insulation layer 342 can be part of molding compound 356 by penetrating through empty dummy TSV structure. The metal layer 348 in core 344 is electrically connected with metal layer 340 or metal post 330. Core 344 may include silicon or other semiconductor material. Before mounting, blind TSVs are preformed in core 344 using a laser drilling, DRIE, or other etching process. The TSVs penetrate partially into the front surface of core 344. The insulation layer 346 is formed over core 344 and into the TSVs. Metal layer 348 is deposited over core 344 and into the TSVs. Metal layer 348 may be deposited conformally and fills the TSVs. Core 344 is mounted facedown to bonding layer 342. Core 344 is background to a desired thickness to remove a back surface of core 344 and expose metal layer 348 of the TSVs. Generally, core 344 is background to a thickness between 50-500 µm. In one embodiment, the thickness of core 344 after backgrinding is between 50-200 µm. An optional RDL may be formed over a surface of core 344. On top of metal layer 348, additional process layer for electrical circuitry can be formed with other metal and insulation routing process before backgrinding to expose the TSV structure at wafer backside.

The insulation layer 349 is deposited and patterned over core 344 to expose metal layer 348. Metal posts 350 are formed over core 344 and are electrically connected to metal layer 348. Metal posts 350 may be formed using a selective plating process. Die 352 are mounted to metal layer 348 using conductive interconnects 354. Wafer level molding compound 356 is deposited over core 344, around metal posts 350 and die 352. Molding compound 356 may optionally include a high resistivity material with a low loss tangent and matched CTE. Wafer molding compound 356 is optionally grinded or etched to a desired thickness. Die 352 may include an optional backside compliant layer 358 and have a total thickness less than or equal to the height of metal posts 350.

An optional interconnect structure is formed over metal posts 350 and die 352 for in-package interconnection and next-level interconnection. Metal layer 360 is deposited and patterned over metal posts 350 and die 352. The insulation layer 362 is deposited over metal layer 360. The insulation layer 362 may be patterned to expose portions of metal layer 360.

Solder material is deposited over metal layer 306 and reflowed to form solder bumps 363. Additional optional interconnect structures or external devices are connected to a top surface of semiconductor package 300. Die 364 is connected to metal layer 360 using electrical interconnects 366. Free-air ball 368 of wirebond 370 is reflowed and connected to metal layer 360. Semiconductor package 300 is singulated to form a plurality of separate semiconductor packages.

Figure 6:
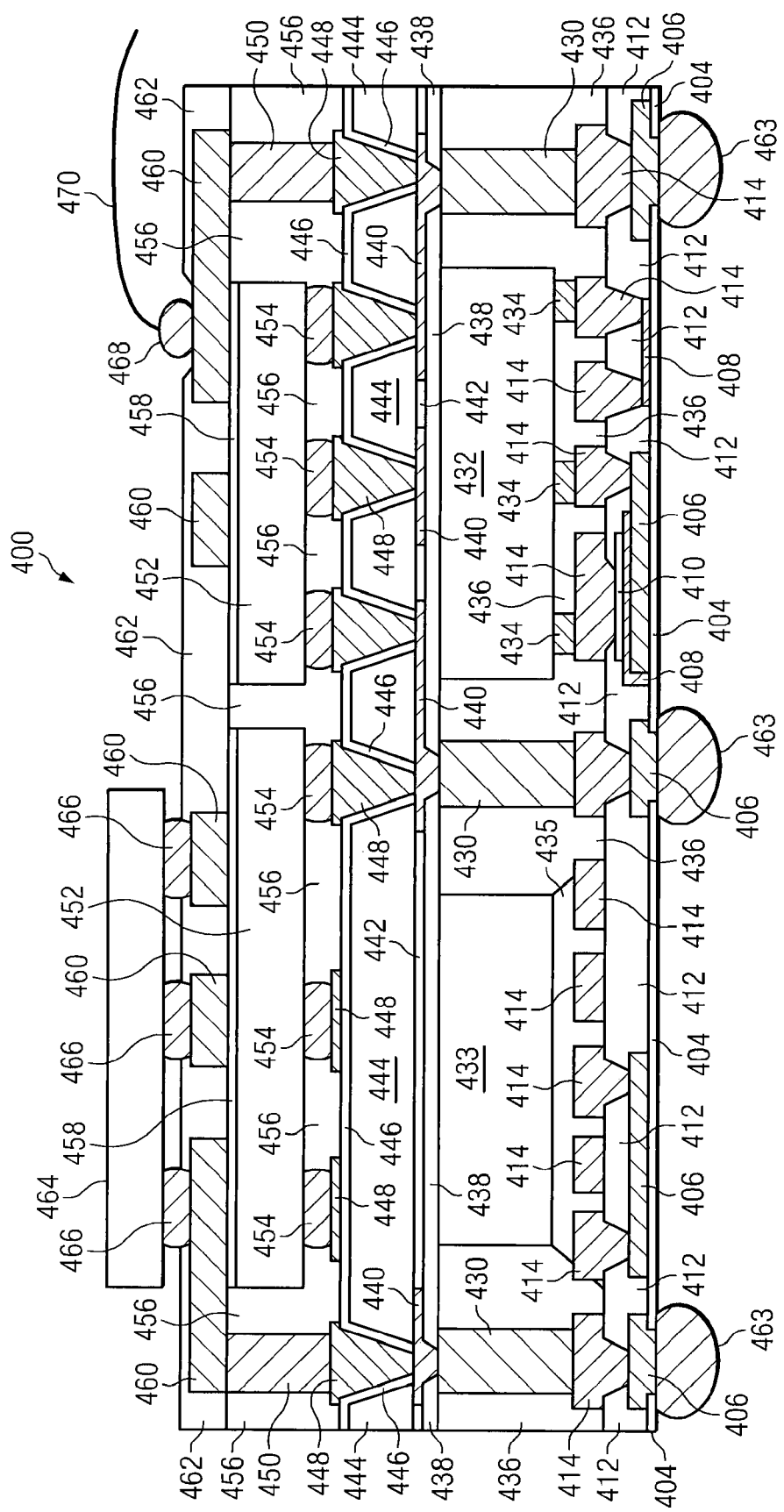
FIG. 6 illustrates a semiconductor package including a core structure and dummy die mounted over an IPD structure.

FIG. 6 illustrates semiconductor package 400 including a core structure and dummy die mounted over the IPD structure. Semiconductor package 400 includes insulation layer 404. An IPD circuit is formed over insulation layer 404 using a fabrication process operated with peak process temperatures greater than 200° C. Metal layer 406 is deposited over insulation layer 404. Resistive layer 408 is deposited over metal layer 406 and insulation layer 404. Dielectric layer 410 is deposited over resistive layer 408. Resistive layer 408 is optionally formed between dielectric layer 410 and metal layer 406. The insulation layer 412 is deposited over insulation layer 404, metal layer 406, resistive layer 408, and dielectric layer 410. Metal layer 414 includes a conductive material and is deposited over insulation layer 412.

Metal posts 430 are formed over semiconductor package 400 and are electrically connected to metal layer 414. Die 432 is mounted to metal layer 414 using conductive interconnects 434. The height of a top surface of die 432 after mounting may be higher or lower than the height of a top surface of metal posts 430. Dummy die 433 is mounted over metal layer 414 using die-attach adhesive 435. Dummy die 433 includes a high resistivity material and is mounted over the inductor portion of metal layer 414 to balance the CTE throughout semiconductor package 400 and to control warpage of the package. Dummy die 433 may include a high resistivity single-crystal material or a multi-crystal material. Dummy die 433 may be used to balance the wafer to control the wafer warpage in the process. The height of a top surface of dummy die 433 after mounting may be higher or lower than the height of a top surface of metal posts 430. Wafer level molding compound 436 is deposited over semiconductor package 400 and around metal posts 430, die 432, and dummy die 433. Molding compound 436 includes a high resistivity material with a low loss tangent and matched CTE. Wafer molding compound 436 is optionally grinded or etched to a desired thickness. Depending upon the application, after grinding of wafer molding compound 436, a top surface of metal posts 430 and top surface of die 432 or dummy die 433 may be exposed.

The insulation layer 438 is deposited over molding compound 436 and patterned to expose metal posts 430. Metal layer 440 is deposited over the patterned regions of insulation layer 438 and is electrically connected to metal posts 430. Bonding layer 442 is deposited over metal layer 440 and insulation layer 438. Bonding layer 442 may include an adhesive die-attach material. Core wafer 444 is mounted to bonding layer 442. Core wafer 444 may include silicon or other semiconductor material. Depending upon application requirements, core 444 is background to a desired thickness. Generally, core 444 is background to a thickness between 50-500 μm. In one embodiment, the thickness of core 444 after backgrinding is between 50-200 μm. TSVs are formed in core 444 using a laser drilling, laser etching, or other etching process. The TSVs penetrate through core 444 and also etch portions of bonding layer 442 to expose metal layer 440. The insulation layer 446 is formed over core 444. Metal layer 448 is deposited over core 444 and into the TSVs. Metal layer 448 may be deposited conformally and fills the TSVs. An optional RDL may be formed over a surface of core 444.

Metal posts 450 are formed over core 444 and are electrically connected to metal layer 448. Metal posts 450 may be formed using a selective plating process. Die 452 are mounted to metal layer 448 using conductive interconnects 454. The height of a top surface of die 452 after mounting may be higher or lower than the height of a top surface of metal posts 450. Wafer level molding compound 456 is deposited over core 444 around metal posts 450 and die 452. Molding compound 456 may optionally include a high resistivity material with a low loss tangent and matched CTE. Wafer molding compound 456 is optionally grinded or etched to a desired thickness. Die 452 may include an optional backside compliant layer 458 and have a total thickness less than or equal to the height of metal posts 450.

An optional interconnect structure is formed over metal posts 450 and die 452 for in-package interconnection and next-level interconnection. Metal layer 460 is deposited and patterned over metal posts 450 and die 452. The insulation layer 462 is deposited over metal layer 460. The insulation layer 462 may be patterned to expose portions of metal layer 460.

Solder material is deposited over metal layer 406 and reflowed to form solder bumps 463. Additional optional interconnect structures or external devices are connected to a top surface of semiconductor package 400. Die 464 is connected to metal layer 460 using electrical interconnects 466. Free-air ball 468 of wirebond 470 is reflowed and connected to metal layer 460. Semiconductor package 400 is singulated to form a plurality of separate semiconductor packages.

Figure 7:
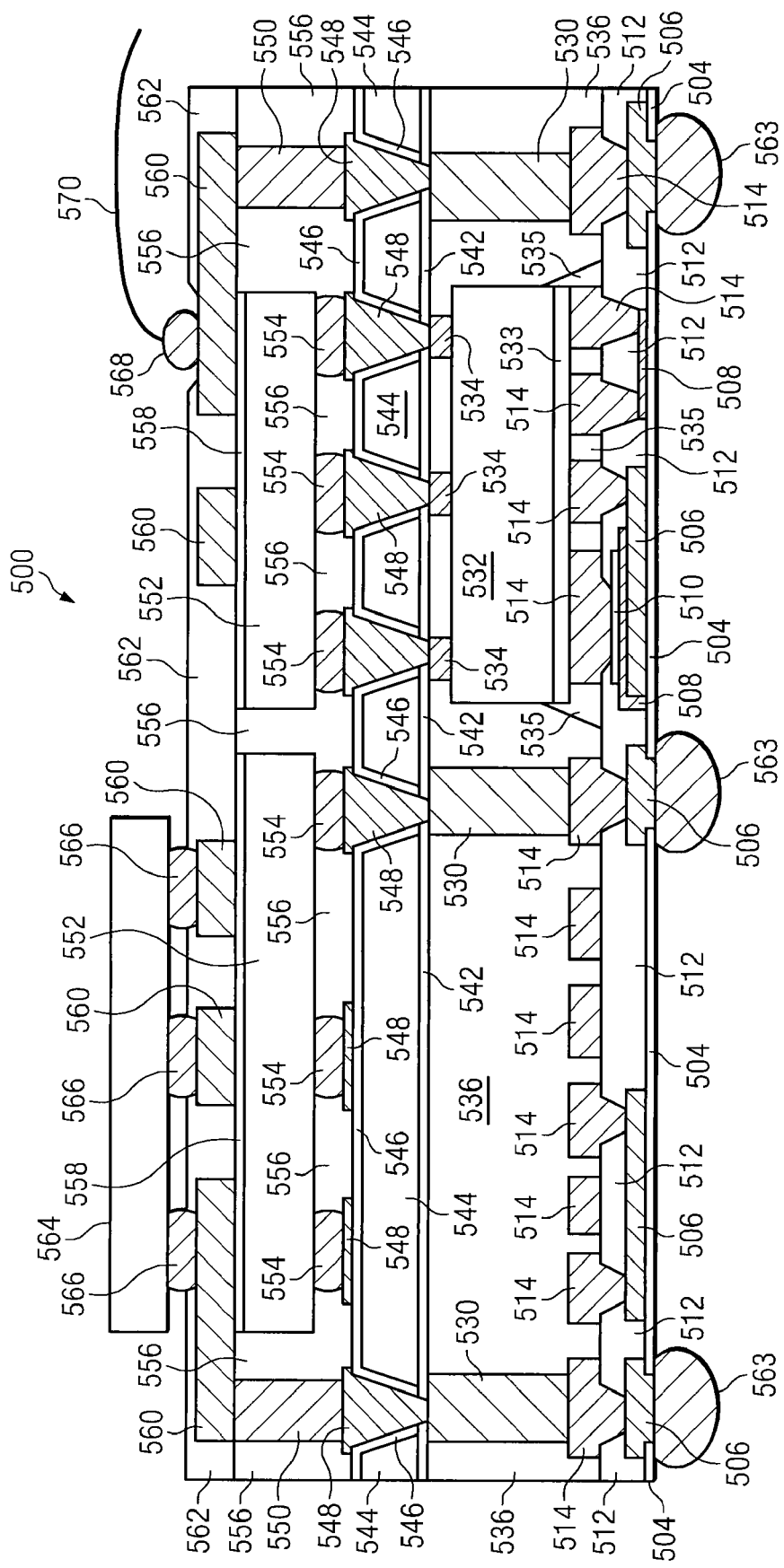
FIG. 7 illustrates a semiconductor package including a core structure and die mounted to the IPD structure and electrically connected to the core structure.

FIG. 7 illustrates semiconductor package 500 including a core structure and die mounted to the IPD structure and electrically connected to the core structure. Semiconductor package 500 includes insulation layer 504. An IPD circuit is formed over insulation layer 504 using a fabrication process operated with peak process temperatures greater than 200° C. Metal layer 506 is deposited over insulation layer 504. Resistive layer 508 is deposited over metal layer 506 and insulation layer 504. Dielectric layer 510 is deposited over resistive layer 508. Resistive layer 508 is optionally formed between dielectric layer 510 and metal layer 506. The insulation layer 512 is deposited over insulation layer 504, metal layer 506, resistive layer 508, and dielectric layer 510. Metal layer 514 includes a conductive material and is deposited over insulation layer 512.

Metal posts 530 are formed over semiconductor package 500 and are electrically connected to metal layer 514. A backside of die 532 is mounted to semiconductor package 500 using pre-built adhesive layer 533. An optional underfill or die attach adhesive 535 may be deposited beneath die 532 to secure die 532 to semiconductor package 500. Die 532 is electrically connected to core 544 by electrical interconnects 534. The interconnects 534 may include solder bumps, conductive adhesive, stud bumps, wirebonds, or other conductive connection. Wafer level molding compound 536 is deposited over semiconductor package 500 and around metal posts 530 and die 532. Molding compound 536 includes a high resistivity material with a low loss tangent and matched CTE. Wafer molding compound 536 is optionally grinded or etched to a desired thickness. Depending upon the application, after grinding of wafer molding compound 536, a top surface of metal posts 530 and top surface of die 532 may be exposed.

Bonding layer 542 with adhesive and insulation property is deposited over wafer molding compound 536. Bonding layer 542 may be applied by spin coating, lamination, or printing. Core 544 is mounted to bonding layer 542. Core 544 may include silicon or other semiconductor material. Depending upon application requirements, core 544 is background to a desired thickness. Generally, core 544 is background to a thickness between 50-500 μm. In one embodiment, the thickness of core 544 after backgrinding is between 50-200 μm. TSVs are formed in core 544 using a laser drilling, laser etching, or other etching process. The TSVs penetrate through core 544 and also etch portions of bonding layer 542 to expose metal posts 530. The insulation layer 546 is formed over core 544. Metal layer 548 is deposited over core 544 and into the TSVs. Metal layer 548 may be deposited conformally and fills the TSVs. An optional RDL may be formed over a surface of core 544.

Metal posts 550 are formed over core 544 and are electrically connected to metal layer 548. Metal posts 550 may be formed using a selective plating process. Die 552 are mounted to metal layer 548 using conductive interconnects 554. The height of a top surface of die 552 after mounting may be higher or lower than the height of a top surface of metal posts 550. Wafer level molding compound 556 is deposited over core 544 around metal posts 550 and die 552. Molding compound 556 may optionally include a high resistivity material with a low loss tangent and matched CTE. Wafer molding compound 556 is optionally grinded or etched to a desired thickness. Die 552 may include an optional backside compliant layer 558 and have a total thickness less than or equal to the height of metal posts 550.

An optional interconnect structure is formed over metal posts 550 and die 552 for in-package interconnection and next-level interconnection. Metal layer 560 is deposited and patterned over metal posts 550 and die 552. The insulation layer 562 is deposited over metal layer 560. The insulation layer 562 may be patterned to expose portions of metal layer 560.

Solder material is deposited over metal layer 506 and reflowed to form solder bumps 563. Additional optional interconnect structures or external devices are connected to a top surface of semiconductor package 500. Die 564 is connected to metal layer 560 using electrical interconnects 566. Free-air ball 568 of wirebond 570 is reflowed and connected to metal layer 560. Semiconductor package 500 is singulated to form a plurality of separate semiconductor packages.

Figure 8:
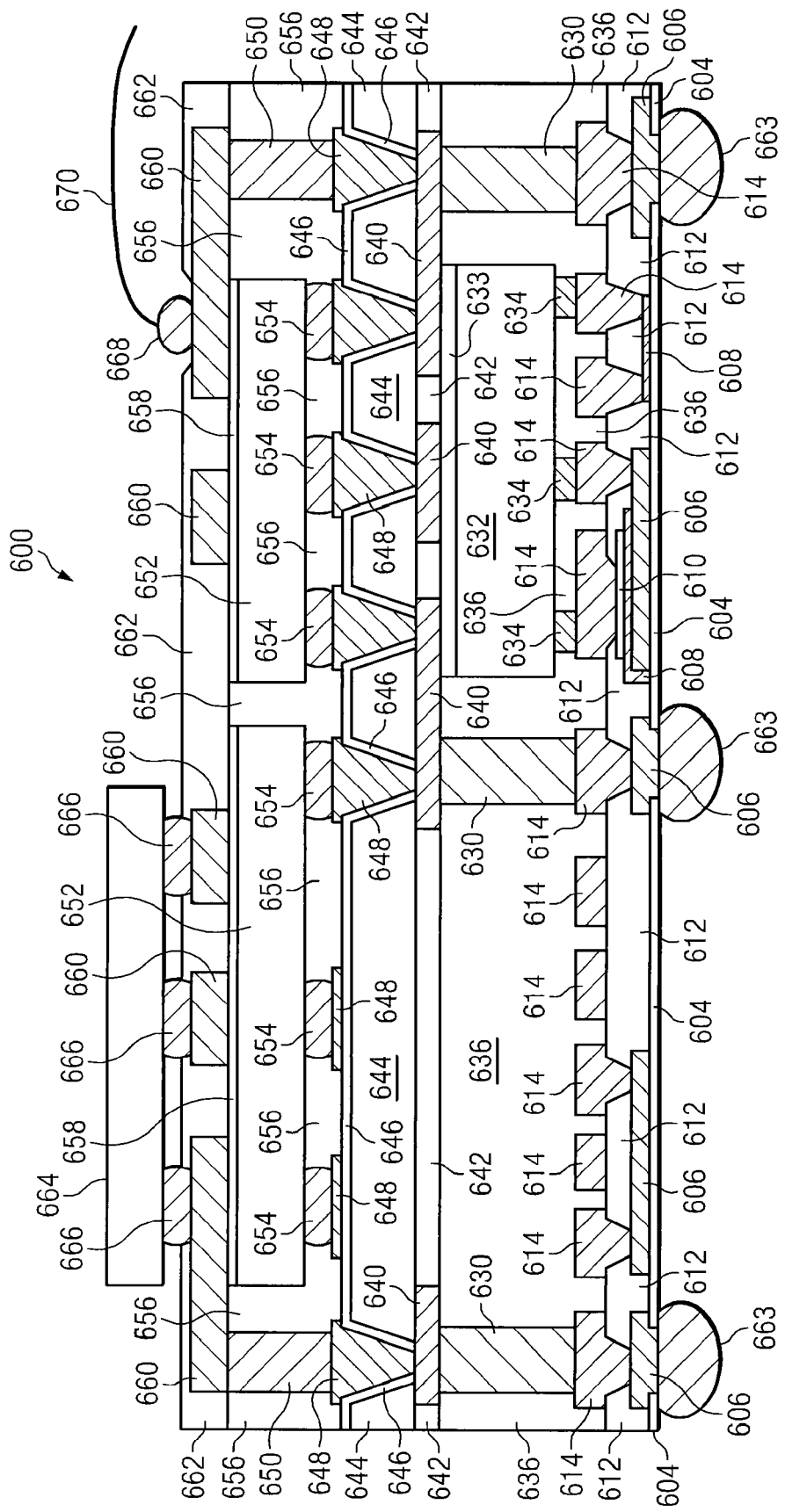
FIG. 8 illustrates a semiconductor package including a core structure having pre-fabricated TSVs and die mounted to the IPD structure.

FIG. 8 illustrates semiconductor package 600 including a core structure having TSVs and die mounted to the IPD structure, the die including a pre-built insulation layer. Semiconductor package 600 includes insulation layer 604. An IPD circuit is formed over insulation layer 604 using a fabrication process operated with peak process temperatures typically greater than 200° C. Metal layer 606 is deposited over insulation layer 604. Resistive layer 608 is deposited over metal layer 606 and insulation layer 604. Dielectric layer 610 is deposited over resistive layer 608. Resistive layer 608 is optionally formed between dielectric layer 610 and metal layer 606. The insulation layer 612 is deposited over insulation layer 604, metal layer 606, resistive layer 608, and dielectric layer 610. Metal layer 614 includes a conductive material and is deposited over insulation layer 612.

Metal posts 630 are formed over semiconductor package 600 and are electrically connected to metal layer 614. Die 632 is mounted to metal layer 614 using conductive interconnects 634. The interconnects 634 may include solder bumps, conductive adhesive, stud bumps, wirebonds, or other conductive connection. An optional pre-built insulation layer 633 is formed over die 632. The insulation layer 633 pre-built at the backside of die 632 may include SiO2, SiO2/Si3N4, or polymer insulation material. Wafer level molding compound 636 is deposited over semiconductor package 600 and around metal posts 630 and die 632. Molding compound 636 includes a high resistivity material with a low loss tangent and matched CTE. Wafer molding compound 636 is optionally grinded or etched to a desired thickness. Depending upon the application, after grinding of wafer molding compound 636, a top surface of metal posts 630 and top surface of die 632 may be exposed.

Bonding layer 642 is deposited over wafer molding compound 636 and backside of die 632. Bonding layer 642 may include a permanent bonding insulation materials deposited by spin coating, lamination, or printing. Core 644 is mounted to bonding layer 642. Core 644 may include silicon or other semiconductor material. Depending upon application requirements, core 644 is background to a desired thickness. Generally, core 644 is background to a thickness between 50-500 μm. In one embodiment, the thickness of core 644 after backgrinding is between 50-200 μm. TSVs are formed in core 644 using a laser drilling, DRIE, or other etching process. The TSVs penetrate through core 644 and also etch portions of bonding layer 642 to expose metal posts 630. The insulation layer 646 is formed over core 644. Metal layer 648 is deposited over core 644 and into the TSVs. Metal layer 648 may be deposited conformally and fills the TSVs. An optional RDL may be formed over a surface of core 644.

Metal posts 650 are formed over core 644 and are electrically connected to metal layer 648. Metal posts 650 may be formed using a selective plating process. Die 652 are mounted to metal layer 648 using conductive interconnects 654. Die 652 may include an optional backside compliant and insulation layer 658 and have a total thickness less than or equal to the height of metal posts 650 in the process. Wafer level molding compound 656 is deposited over core 644 around metal posts 650 and die 652. Molding compound 656 may optionally include a high resistivity material with a low loss tangent and matched CTE. Wafer molding compound 656 is optionally grinded or etched to a desired thickness.

An optional interconnect structure is formed over metal posts 650 and die 652 for in-package interconnection and next-level interconnection. Metal layer 660 is deposited and patterned over metal posts 650 and die 652. The insulation layer 662 is deposited over metal layer 660. The insulation layer 662 may be patterned to expose portions of metal layer 660.

Solder material is deposited over metal layer 606 and reflowed to form solder bumps 663. Additional optional interconnect structures or external devices are connected to a top surface of semiconductor package 600. Die 664 is connected to metal layer 660 using electrical interconnects 666. Free-air ball 668 of wirebond 670 is reflowed and connected to metal layer 660. Semiconductor package 600 is singulated to form a plurality of separate semiconductor packages.

Figure 9:
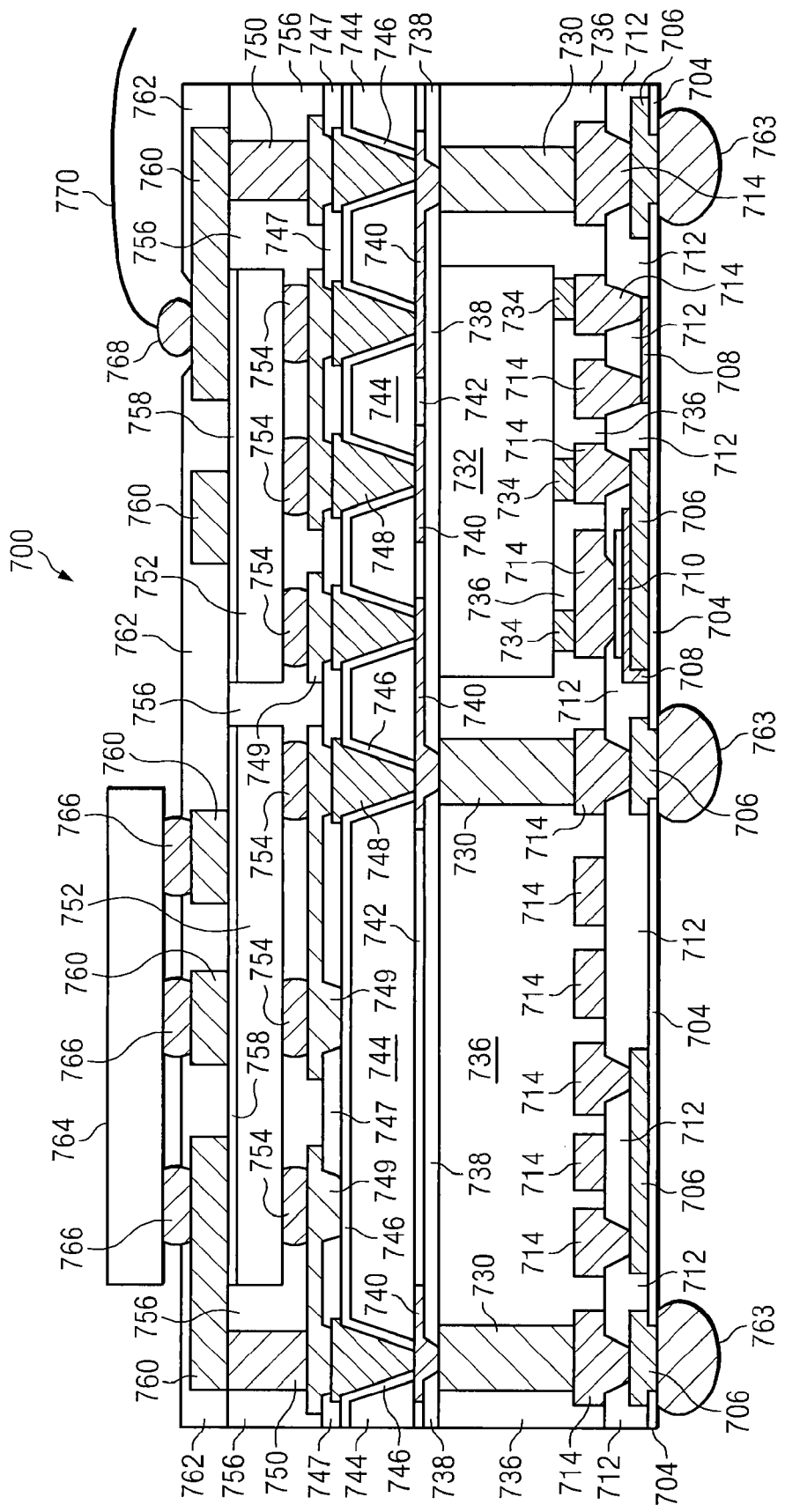
FIG. 9 illustrates a semiconductor package including a core structure having pre-fabricated TSVs and an RDL formed over the core structure.

FIG. 9 illustrates semiconductor package 700 including a core structure having TSVs and an RDL interconnection formed over the core structure. Semiconductor package 700 includes insulation layer 704. An IPD circuit is formed over insulation layer 704 using a fabrication process operated with peak process temperatures greater than 200° C. Metal layer 706 is deposited over insulation layer 704. Resistive layer 708 is deposited over metal layer 706 and insulation layer 704. Dielectric layer 710 is deposited over resistive layer 708. Resistive layer 708 is optionally formed between dielectric layer 710 and metal layer 706. The insulation layer 712 is deposited over insulation layer 704, metal layer 706, resistive layer 708, and dielectric layer 710. Metal layer 714 includes a conductive material and is deposited over insulation layer 712.

Metal posts 730 are formed over semiconductor package 700 and are electrically connected to metal layer 714. Die 732 is mounted to metal layer 714 using conductive interconnects 734. The interconnects 734 may include solder bumps, conductive adhesive, stud bumps, wirebonds, or other conductive connection. Wafer level molding compound 736 is deposited over semiconductor package 700 and around metal posts 730 and die 732. Molding compound 736 includes a high resistivity material with a low loss tangent and matched CTE. Wafer molding compound 736 is optionally grinded or etched to a desired thickness. Depending upon the application, after grinding of wafer molding compound 736, a top surface of metal posts 730 and top surface of die 732 may be exposed.

The insulation layer 738 is deposited over molding compound 736 and patterned to expose metal posts 730. Metal layer 740 is deposited over the patterned regions of insulation layer 738 and is electrically connected to metal posts 730. Bonding layer 742 with insulation property is deposited over metal layer 740 and insulation layer 738. Bonding layer 742 may be applied by spin coating, lamination, or printing. Core 744 is mounted to bonding layer 742. Core 744 may include silicon or other semiconductor material. Core 744 may also include high resistivity Si materials with surface passivation. Depending upon application requirements, core 744 is background to a desired thickness. Generally, core 744 is background to a thickness between 50-500 µm. In one embodiment, the thickness of core 744 after backgrinding is between 50-200 µm. TSVs are formed in core 744 using a laser drilling, laser etching, or other etching process. The TSVs penetrate through core 744 and also etch portions of bonding layer 742 to expose metal layer 740. The insulation layer 746 is formed over core 744. Metal layer 748 is deposited over core 744 and into the TSVs. Metal layer 748 may be deposited conformally and fills the TSVs. An RDL interconnection is formed over a surface of core 744. RDL interconnection may include passive circuitry as well, such as capacitor, resistor and inductor. As an example, insulation layer 747 is deposited over core 744 and patterned to expose metal layer 748. Metal layer 749 is deposited over insulation layer 747 and provides for re-routing electrical connections over a surface of core 744 within semiconductor package 700.

Metal posts 750 are formed over core 744 and are electrically connected to metal layer 749. Metal posts 750 may be formed using a selective plating process. Die 752 are mounted to metal layer 749 using conductive interconnects 754. Die 752 may include an optional backside compliant layer 758 and have a total thickness less than or equal to the height of metal posts 750. Wafer level molding compound 756 is deposited over core 744 around metal posts 750 and die 752. Molding compound 756 may optionally include a high resistivity material with a low loss tangent and matched CTE. Wafer molding compound 756 is optionally grinded or etched to a desired thickness.

An optional interconnect structure is formed over metal posts 750 and die 752 for in-package interconnection and next-level interconnection. Metal layer 760 is deposited and patterned over metal posts 750 and die 752. The insulation layer 762 is deposited over metal layer 760. The insulation layer 762 may be patterned to expose portions of metal layer 760.

Solder material is deposited over metal layer 706 and reflowed to form solder bumps 763. Additional optional interconnect structures or external devices are connected to a top surface of semiconductor package 700. Die 764 is connected to metal layer 760 using electrical interconnects 766. Free-air ball 768 of wirebond 770 is reflowed and connected to metal layer 760. Semiconductor package 700 is singulated to form a plurality of separate semiconductor packages.

Figure 10C:
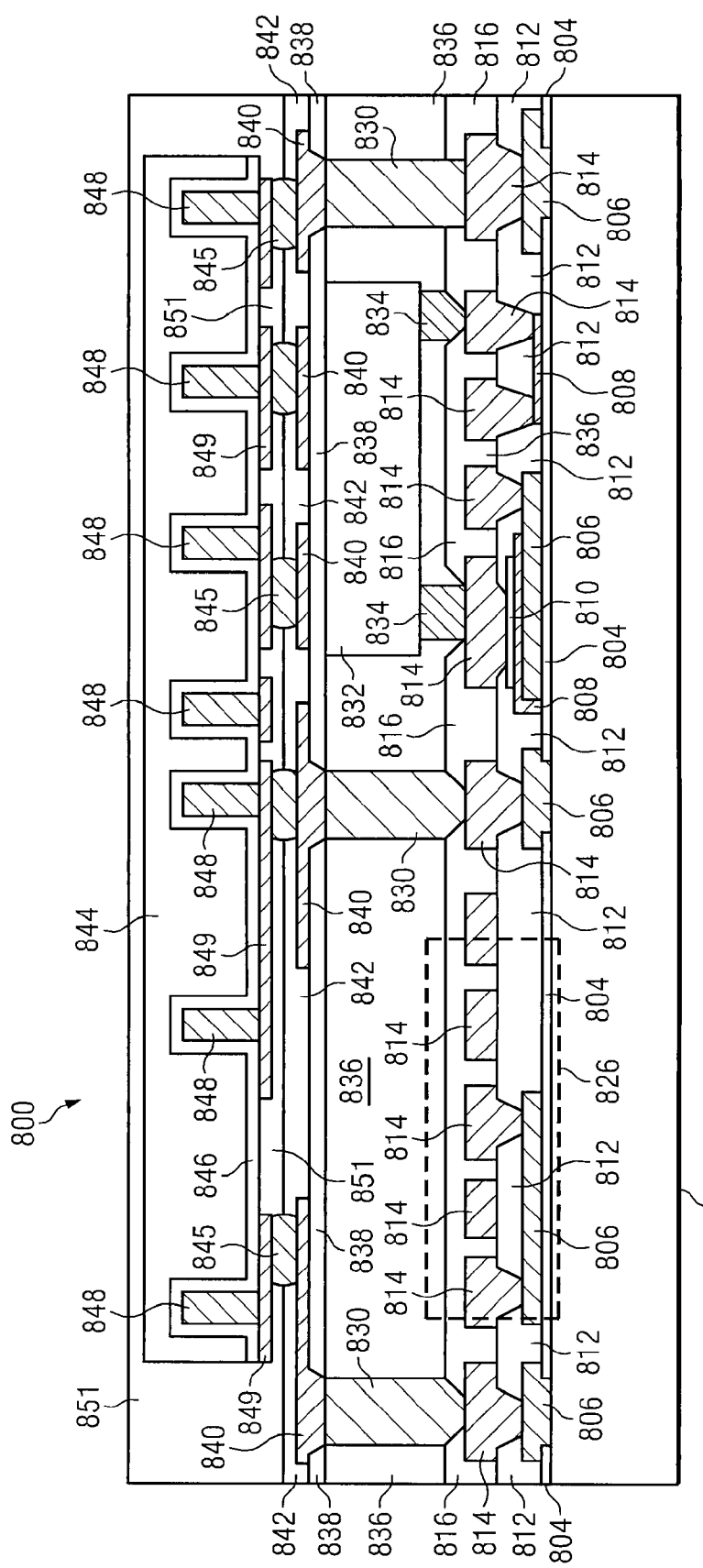

FIGS. 10a-10e illustrate a method of forming semiconductor package 800 having an embedded semiconductor core with pre-fabricated conductive TSVs. As shown in FIG. 10a, dummy wafer 802 is made with silicon or other semiconductor or rigid material. The insulation layer 804 is optionally formed over dummy wafer 802 and is typically made with Sio2, but can also be made with Si3N4, SiON, Ta2O5, ZrO2, Al2O3, or other material having dielectric properties. The deposition of insulation layer 804 involves CVD, or thermal oxidation. The insulation layer 804 may be patterned before deposition of metal layer 806 or after removal of dummy wafer 802.

An IPD or passive circuit is formed over dummy wafer 802. Generally the fabrication process is operated with peak process temperatures greater than 200° C. The IPD circuit may include various passive devices such as capacitors, resistors, and inductors that are formed over a surface of dummy wafer 802. Metal layer 806 is deposited over insulation layer 804. Resistive layer 808 is deposited over metal layer 806 and insulation layer 804 and includes TaxSiy or other metal silicides, TaN, NiCr, TiN, or doped polysilicon. Dielectric layer 810 is deposited over resistive layer 808. Dielectric layer 810 can be Si3N4, Ta2O5, HfO2, or a dielectric film material. In the present embodiment, resistive layer 808, formed between dielectric layer 810 and metal layer 806, is optional. The insulation layer 812 is deposited over insulation layer 804, metal layer 806, resistive layer 808, and dielectric layer 810. Metal layer 814 includes a conductive material and is deposited over insulation layer 812 using a PVD, CVD, electrolytic plating, or electroless plating process.

The combination of metal, insulation, dielectric, and resistive layers forms one or more passive devices over a surface of dummy wafer 802. Box 822 shown on FIG. 10a indicates a resistor structure formed over dummy wafer 802 that includes portions of resistive layer 808 and metal layer 814. Box 824 indicates a capacitor structure formed over dummy wafer 802 that includes portions of metal layer 806, resistive layer 808, dielectric layer 810, and metal layer 814. Portions of metal layers 806 and 814 form the electrodes of the capacitor indicated by box 824. Box 826 indicates an inductor structure formed over dummy wafer 802 that includes portions of metal layer 814. In alternative embodiments, different combinations of passive devices, RF circuitry, or other electronic circuits are formed over dummy wafer 802 to provide the necessary functionality of semiconductor package 800. During the fabrication process, the IPD devices may be tested at wafer level to improve the yield of semiconductor package 800. The insulation or passivation layer 816 is optionally deposited over dummy wafer 802 to provide electrical isolation and physical protection to semiconductor package 800. The insulation layer 816 is patterned to expose portions of metal layer 814.

Metal posts 830 are formed over semiconductor package 800 and are electrically connected to metal layer 814. Metal posts 830 may be formed using a selective plating process and may include conductive materials. Alternatively, metal posts 830 may be formed as stud bonded Al or Au bumps, or solder balls.

Turning to FIG. 10b, die 832 is mounted to metal layer 814 using conductive interconnects 834 such as solder bumps, conductive adhesive, conductive studs, or wirebonds. Depending upon design requirement, die 832 may be mounted anywhere over dummy wafer 802. The height of a top surface of die 832 after mounting may be higher or lower than the height of a top surface of metal posts 830. Wafer level molding compound 836 is deposited over semiconductor package 800 and around metal posts 830 and die 832. Molding compound 836 includes a high resistivity material with a low loss tangent and matched CTE such as polymer (resin) matrix composite with fillers to adjust its mechanical, thermal, and electrical properties. Wafer molding compound 836 is optionally grinded or etched to a desired thickness. Depending upon the application, after grinding of wafer molding compound 836, a top surface of metal posts 830 and top surface of die 832 may be exposed.

Turning to FIG. 10c, insulation layer 838 is deposited over molding compound 836 and patterned to expose metal posts 830. The insulation layer 838 is optional and is not deposited if metal layer 840 is not overlapping die 832, or is used as a heat sink for die 832. Metal layer 840 is deposited over the patterned regions of insulation layer 838 and is electrically connected to metal posts 830. Metal layer 840 may form various circuit components including ground planes, coupling lines, power lines, and interconnects. Optional insulation layer 842 is deposited over metal layer 840 and insulation layer 838. The insulation layer 842 is not deposited, for example, if there are stacked metal layers formed within metal layer 840 to define input/output pad size. As another embodiment, metal layer 840 and insulation layer 838 is not in package 800. Core 844 is directly flip-chipped over metal post 830.

Core die 844 is mounted to metal layer 840 using electrical interconnects 845. The interconnects 845 may include solder bumps, stud bumps, wirebonds, or other electrical interconnect devices. Core die 844 may include silicon or other semiconductor material. Core 844 includes pre-fabricated conductive vias. Before mounting, TSVs are formed in core 844 using a laser drilling, DRIE, or other etching process. The TSVs are blind vias and only penetrate partially into core die 844. The insulation layer 846 is formed over core 844 and into the vias. As shown on FIG. 10c, insulation layer 846 may be formed as a conformal surface over core 844. Metal is deposited over core 844 and into the TSVs to form conductive vias 848. An optional RDL interconnection may be formed over the surface of core 844. The RDL may include both interconnect layer and passive circuitry including for example capacitor, resistor, and inductors. Alternatively, it may be only for redistribution purpose. For example, layer 849 is formed over a surface of core 844 and includes a conductive material. Core die 844 is inverted and flip chip mounted to semiconductor package 800. Wafer molding compound or molded underfill 851 is deposited over and around core 844 using wafer level molding, or other deposition processes, such as LCP material lamination.

Figure 10D:
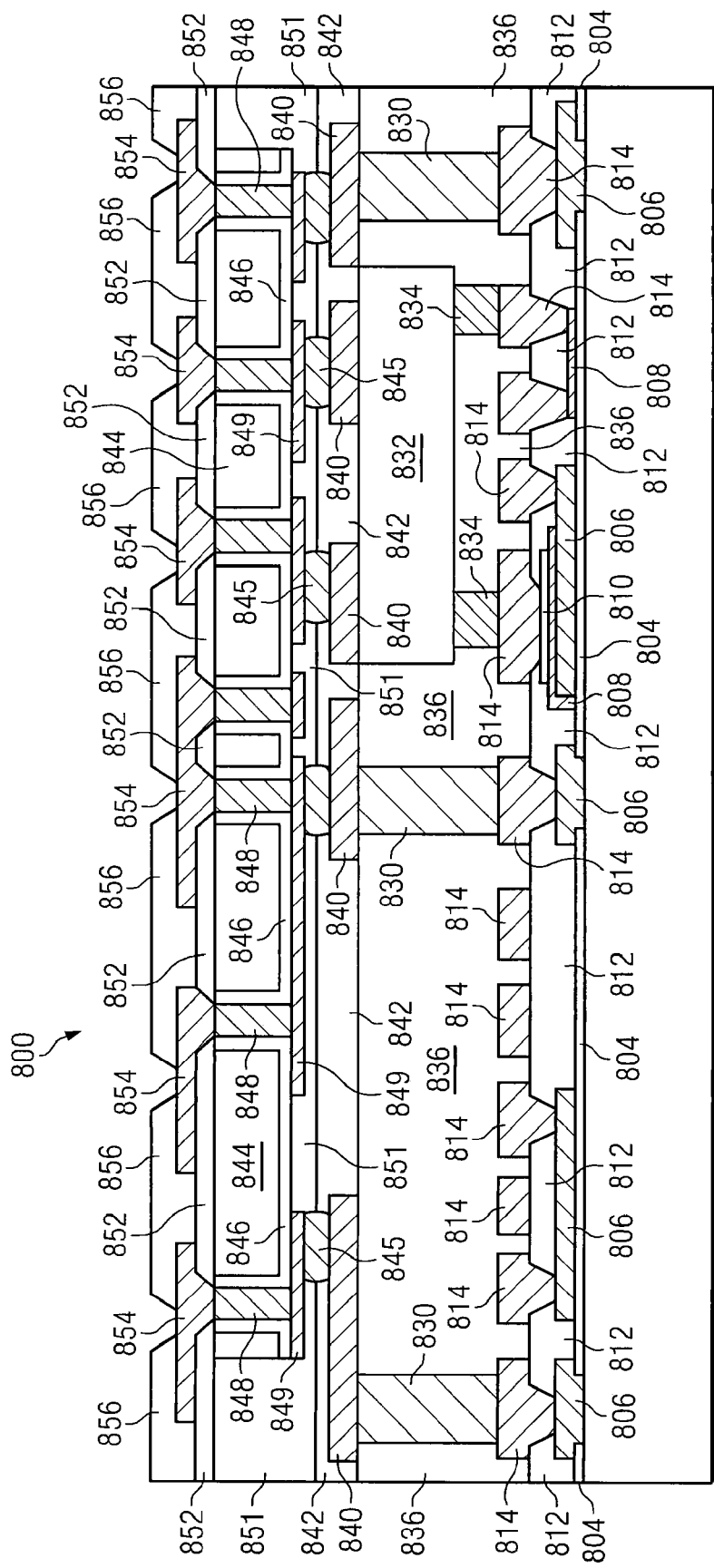

Turning to FIG. 10d, core 844 and wafer molding compound 851 are background to expose conductive vias 848 and to thin core 844 to a desired thickness. Generally, core 844 is background to a thickness between 50-500 μm. In one embodiment, the thickness of core 844 after backgrinding is between 50-200 μm. An optional RDL or interconnect structure is formed over the backside of core 844. The insulation layer 852 is deposited and patterned over wafer molding compound 851 and core 844 to expose portions of conductive vias 848. Metal layer 854 is deposited over insulation layer 852 and is electrically connected to conductive vias 848. The insulation layer 856 is deposited and patterned over metal layer 854.

Figure 10E:
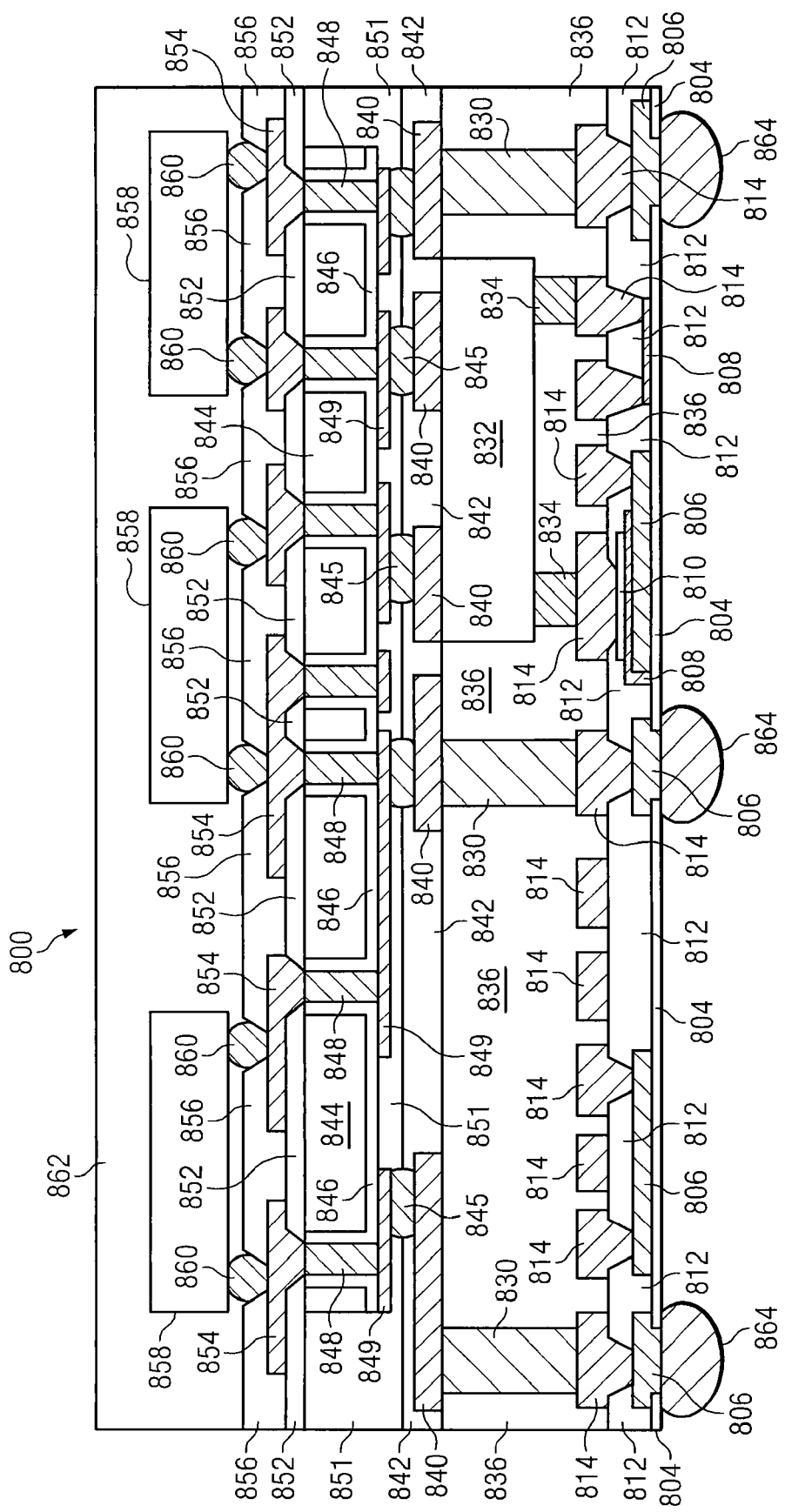

Turning to FIG. 10e, die 858 are mounted over and electrically connected to core 844 using conductive interconnects 860. The interconnects 860 may include solder bumps, conductive adhesive, conductive studs, or wirebonds. Molding compound 862 is deposited over and around die 858. Dummy wafer 802 is removed using thermal, chemical, mechanical, plasma etching methods, or other wafer-removal processes. Alternatively, dummy wafer 802 may be removed after the molding process for layer 851. Electrical interconnects 864 are formed over semiconductor package 800 and connected to metal layer 806. Electrical interconnects 864 may include solder bumps, stud bumps, or wirebonds.

Figure 11:
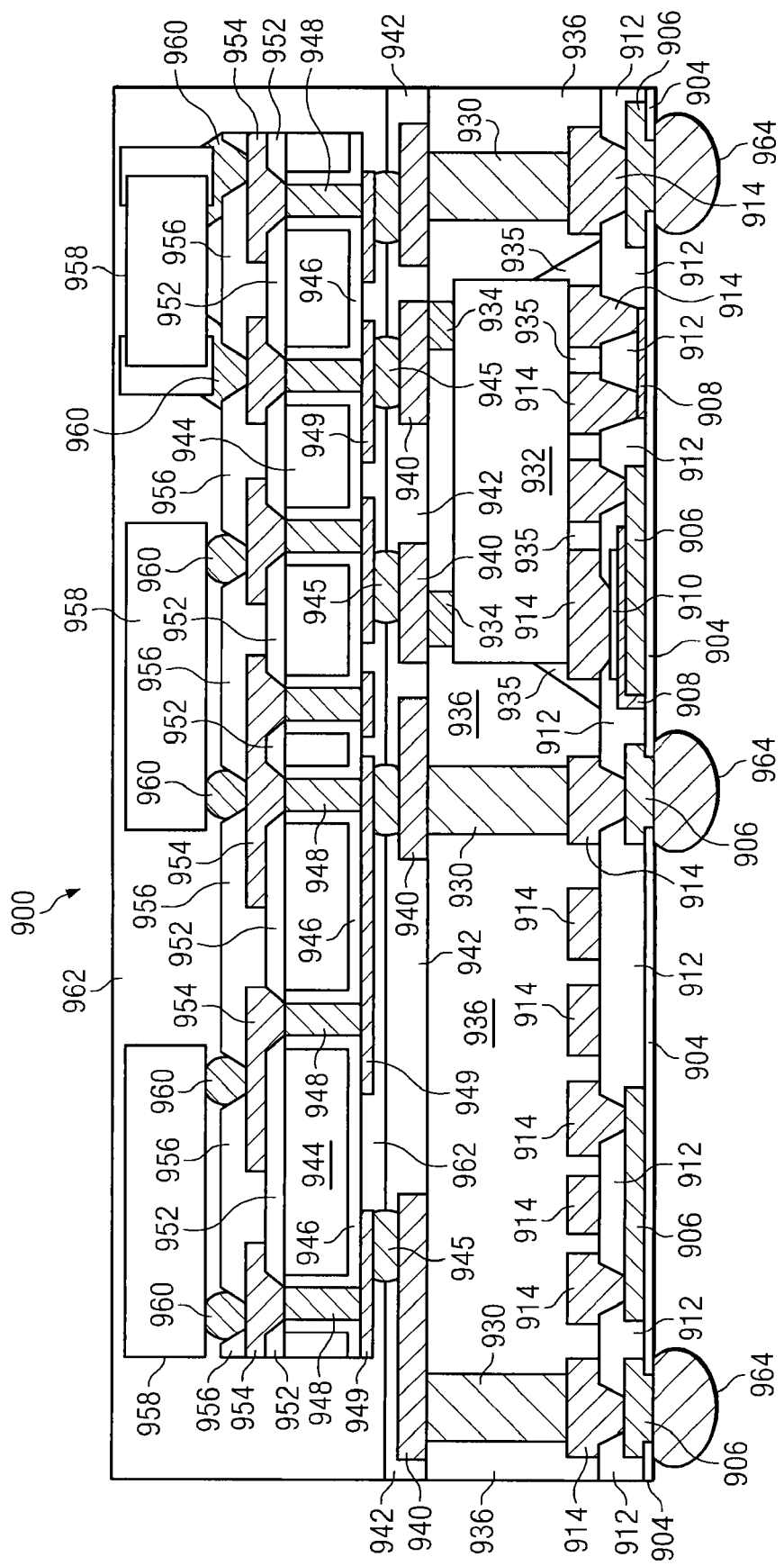
FIG. 11 illustrates a semiconductor package having a semiconductor core with pre-fabricated conductive TSVs and die mounted over an IPD structure of the semiconductor package.

FIG. 11 illustrates semiconductor package 900 having a semiconductor core with pre-fabricated conductive TSVs and die mounted over an IPD structure of semiconductor package 900. Semiconductor package 900 includes insulation layer 904. An IPD circuit is formed within semiconductor package 900. Generally the fabrication process is operated with peak process temperatures greater than 200° C. The IPD circuit may include various passive devices such as capacitors, resistors, and inductors.

As shown on FIG. 11, metal layer 906 is deposited over insulation layer 904. Resistive layer 908 is deposited over metal layer 906 and insulation layer 904 and includes TaxSiy or other metal silicides, TaN, NiCr, TiN, or doped polysilicon. Dielectric layer 910 is deposited over resistive layer 908. In the present embodiment, resistive layer 908, formed between dielectric layer 910 and metal layer 906, is optional. The insulation layer 912 is deposited over insulation layer 904, metal layer 906, resistive layer 908, and dielectric layer 910. Metal layer 914 includes a conductive material and is deposited over insulation layer 912 using a PVD, CVD, electrolytic plating, or electroless plating process.

Metal posts 930 are formed over semiconductor package 900 and are electrically connected to metal layer 914. Metal posts 930 may be formed using a selective plating process and may include conductive materials. Alternatively, metal posts 930 may be formed as stud bonded Al or Au bumps, or solder balls.

A backside of die 932 is mounted to semiconductor package 900 using adhesive or die-attach material 935. Die 932 is electrically connected to core 944 by electrical interconnects 934. The interconnects 934 may include solder bumps, conductive adhesive, stud bumps, wirebonds, or other conductive connection. Depending upon the application, before mounting, die 932 may be background to a preferred thickness. Wafer level molding compound 936 is deposited over semiconductor package 900 and around metal posts 930 and die 932. Wafer level molding compound 936 is deposited over semiconductor package 900 and around metal posts 930 and die 932. Molding compound 936 includes a high resistivity material with a low loss tangent and matched CTE such as polymer (resin) matrix composite with fillers to adjust its mechanical, thermal, and electrical properties. Wafer molding compound 936 is optionally grinded or etched to a desired thickness. Depending upon the application, after grinding of wafer molding compound 936, a top surface of metal posts 930 and top surface of die 932 may be exposed.

Metal layer 940 is deposited over wafer molding compound 936 and is electrically connected to metal posts 930. Metal layer 940 may form various circuit components including ground planes, coupling lines, power lines, and interconnects. Optional insulation layer or die-attach layer 942 is deposited and patterned over metal layer 940. Alternatively, both layer 942 and 940 is not presented with core 944 is directly connected with metal 930 through interconnects 945.

Core 944 is mounted to metal layer 940 using electrical interconnects 945. The interconnects 945 may include solder bumps, stud bumps, wirebonds, or other electrical interconnect devices. Core 944 may include silicon or other semiconductor material. Core 944 includes pre-fabricated conductive vias. Before mounting, TSVs are formed in core 944 using a laser drilling, DRIE, or other etching process. The TSVs penetrate into core 944. The insulation layer 946 is formed over core 944 and into the vias. The insulation layer 946 may be formed as a conformal surface over core 944. Metal is deposited over core 944 and into the TSVs to form conductive vias 948. If conductive vias 948 are blind, a portion of the back surface of core 944 may be removed to expose conductive vias 948 on both sides of core 944. Optional RDLs are formed over both surfaces of core 944. RDL 949 is formed over a first surface of core 944 and includes a conductive material. A second RDL or interconnect structure is formed over a second surface of core 944. The insulation layer 952 is deposited and patterned over core 944 to expose portions of conductive vias 948. Metal layer 954 is deposited over insulation layer 952 and is electrically connected to conductive vias 948. The insulation layer 956 is deposited and patterned over metal layer 954. Core 944 is mounted to semiconductor package 900.

Die 958 are mounted over and electrically connected to core 944 using conductive interconnects 960. The interconnects 960 may include solder bumps, conductive adhesive, conductive studs, or wirebonds. Molding compound 962 is deposited over and around die 958. Electrical interconnects 964 are formed over semiconductor package 900 and connected to metal layer 906. Electrical interconnects 964 may include solder bumps, stud bumps, or wirebonds.

Figure 12:
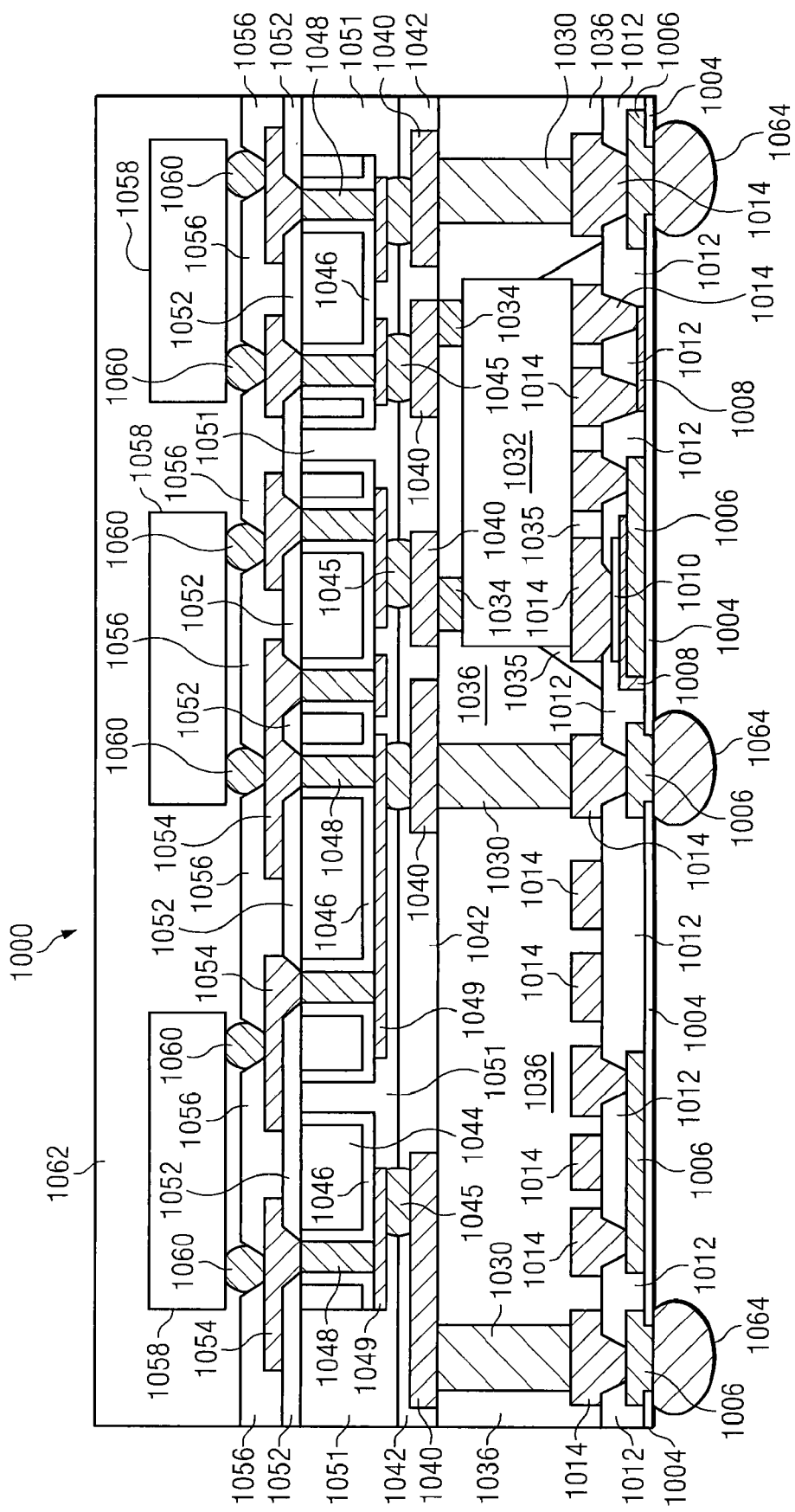
FIG. 12 illustrates a semiconductor package having a semiconductor core with pre-fabricated conductive TSVs and dummy vias.

FIG. 12 illustrates semiconductor package 1000 having a semiconductor core with pre-fabricated conductive TSVs and dummy vias. Semiconductor package 1000 includes insulation layer 1004. An IPD circuit is formed within semiconductor package 1000. Generally the fabrication process is operated with peak process temperatures greater than 200° C. The IPD circuit may include various passive devices such as capacitors, resistors, and inductors.

As shown on FIG. 12, metal layer 1006 is deposited over insulation layer 1004. Resistive layer 1008 is deposited over metal layer 1006 and insulation layer 1004 and includes TaxSiy or other metal silicides, TaN, NiCr, TiN, or doped polysilicon. Dielectric layer 1010 is deposited over resistive layer 1008. In the present embodiment, resistive layer 1008, formed between dielectric layer 1010 and metal layer 1006, is optional. The insulation layer 1012 is deposited over insulation layer 1004, metal layer 1006, resistive layer 1008, and dielectric layer 1010. Metal layer 1014 includes a conductive material and is deposited over insulation layer 1012 using a PVD, CVD, electrolytic plating, or electroless plating process.

Metal posts 1030 are formed over semiconductor package 1000 and are electrically connected to metal layer 1014. Metal posts 1030 may be formed using a selective plating process and may include conductive materials. Alternatively, metal posts 1030 may be formed as stud bonded Al or Au bumps, or solder balls.

A backside of die 1032 is mounted to semiconductor package 1000 using adhesive or die-attach material 1035. Die 1032 is electrically connected to core 1044 by electrical interconnects 1034. The interconnects 1034 may include solder bumps, conductive adhesive, stud bumps, wirebonds, or other conductive connection. Wafer level molding compound 1036 is deposited over semiconductor package 1000 and around metal posts 1030 and die 1032. Molding compound 1036 includes a high resistivity material with a low loss tangent and matched CTE such as polymer (resin) matrix composite with fillers to adjust its mechanical, thermal, and electrical properties. Wafer molding compound 1036 is optionally grinded or etched to a desired thickness. Depending upon the application, after grinding of wafer molding compound 1036, a top surface of metal posts 1030 and top surface of die 1032 may be exposed.

Metal layer 1040 is deposited over wafer molding compound 1036 and is electrically connected to metal posts 1030. Metal layer 1040 may form various circuit components including ground planes, coupling lines, power lines, and interconnects. Optional insulation layer 1042 is deposited and patterned over metal layer 1040.

Core 1044 is mounted to metal layer 1040 using electrical interconnects 1045. The interconnects 1045 may include solder bumps, stud bumps, wirebonds, or other electrical interconnect devices. Core 1044 may include silicon or other semiconductor material. Core 1044 includes pre-fabricated conductive vias. Before mounting, TSVs and dummy vias are formed in core 1044 using a laser drilling, laser etching, or other etching process. The TSVs are blind vias and only penetrate partially into core 1044. The insulation layer 1046 is formed over core 1044 and into the vias. As shown on FIG. 12, insulation layer 1046 may be formed as a conformal surface over core 1044. Metal is deposited over core 1044 and into some of the TSVs (not including the dummy vias) to form conductive vias 1048. An optional RDL 1049 is formed over a surface of core 1044 and includes a conductive material. Core 1044 is inverted and flip chip mounted to semiconductor package 1000. Wafer molding compound or molded underfill 1051 is deposited over and around core 1044 using wafer level molding, or other deposition processes. A portion of wafer molding compound 1051 is deposited into the dummy wafers of core 1044 to enhance the strength of the physical connection between core 1044 and the other components of semiconductor package 1000.

Core 1044 and wafer molding compound are background to expose conductive vias 1048 and to thin core 1044 to a desired thickness. Generally, core 1044 is background to a thickness between 50-500 μm. In one embodiment, the thickness of core 1044 after backgrinding is between 50-200 μm. An optional RDL or interconnect structure is formed over core 1044. The insulation layer 1052 is deposited and patterned over wafer molding compound 1051 and core 1044 to expose portions of conductive vias 1048. Metal layer 1054 is deposited over insulation layer 1052 and is electrically connected to conductive vias 1048. The insulation layer 1056 is deposited and patterned over metal layer 1054.

Die 1058 are mounted over and electrically connected to core 1044 using conductive interconnects 1060. The interconnects 1060 may include solder bumps, conductive adhesive, conductive studs, or wirebonds. Molding compound 1062 is deposited over and around die 1058. Electrical interconnects 1064 are formed over semiconductor package 1000 and connected to metal layer 1006. Electrical interconnects 1064 may include solder bumps, stud bumps, or wirebonds.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a temporary carrier for supporting the semiconductor device;
   an integrated passive device (IPD) structure disposed over the temporary carrier, the IPD structure including an inductor, resistor, or capacitor;
   a plurality of first conductive posts disposed over the temporary carrier;
   a first semiconductor die mounted to the IPD structure with a flipchip interconnect;
   a first wafer molding compound deposited over the first conductive posts and first semiconductor die;
   a core structure bonded to the first conductive posts over the first semiconductor die, the core structure including a silicon material;
   a plurality of conductive through silicon vias (TSVs) disposed in the core structure;
   a first redistribution layer disposed over the core structure;
   a plurality of second conductive posts disposed over the core structure;

a second semiconductor die mounted over the core structure with a flipchip interconnect, the second semiconductor die being electrically connected to the core structure;

a second wafer molding compound deposited over the second conductive posts and the second semiconductor die; and a second redistribution layer disposed over the second molding compound and second semiconductor die.

2. The semiconductor device of claim 1, wherein the first wafer molding compound comprises:

a polymer material having a loss tangent less than 0.01; and
fillers to match a coefficient of thermal expansion of the semiconductor device.

3. The semiconductor device of claim 1, further comprising an electrical interconnect structure connected to the second conductive posts.

4. The semiconductor device of claim 1, further comprising a dummy die mounted over the IPD structure.

5. The semiconductor device of claim 4, the dummy die comprising a single-crystal material.

6. The semiconductor device of claim 4, the dummy die comprising a multi-crystal wafer material.

7. The semiconductor device of claim 1, further comprising conductive interconnects that electrically connect the first semiconductor die to the IPD structure.

8. A semiconductor device, comprising:
an integrated passive device (IPD) structure;
a first semiconductor die mounted to the IPD structure with a flipchip interconnect;
a plurality of first conductive posts disposed adjacent to the first semiconductor die;
a first molding compound disposed over the first conductive posts and first semiconductor die;
a core structure bonded to the first conductive posts over the first semiconductor die;
a plurality of conductive through silicon vias (TSVs) disposed in the core structure;
a plurality of second conductive posts disposed over the core structure;
a second semiconductor die mounted over the core structure, the second semiconductor die electrically connected to the core structure; and
a second molding compound deposited over the second conductive posts and second semiconductor die.

9. The semiconductor device of claim 8, further comprising:
a first redistribution layer disposed over the core structure; and
a second redistribution layer disposed over the second molding compound and second semiconductor die.

10. The semiconductor device of claim 9, wherein the conductive TSVs are electrically connected to the first redistribution layer over the first conductive posts and first semiconductor die.

11. The semiconductor device of claim 8, further comprising an electrical interconnect structure electrically connected to the second conductive posts.

12. The semiconductor device of claim 8, further comprising a dummy die mounted over the IPD structure, the dummy die comprising a single-crystal material or a multi-crystal wafer material.

13. The semiconductor device of claim 8, further comprising a temporary carrier, the IPD structure mounted over the temporary carrier.

14. A semiconductor device, comprising:
an integrated passive device (IPD) structure;
a first semiconductor die mounted to the IPD structure;
a plurality of first conductive posts disposed over the IPD structure and outside a footprint of the first semiconductor die;
a first molding compound deposited over the first conductive posts, IPD structure, and first semiconductor die; and
a wafer core structure bonded to the first conductive posts over the first semiconductor die, the wafer core structure having sufficient area to cover the first conductive posts and first semiconductor die.

15. The semiconductor device of claim 14, further comprising a carrier disposed under the IPD structure.

16. The semiconductor device of claim 14, the first semiconductor die comprising a dummy die.

17. The semiconductor device of claim 14, the first semiconductor die comprising an active semiconductor die.

18. The semiconductor device of claim 14, further comprising:
a plurality of second conductive posts disposed over the wafer core structure;
a second semiconductor die mounted over the semiconductor device, the second semiconductor die electrically connected to the wafer core structure; and
a second molding compound deposited over the second conductive posts and second semiconductor die.

19. A semiconductor device, comprising:
an integrated passive device (IPD) structure;
a first semiconductor die mounted to the IPD structure;
a plurality of first conductive posts disposed over the IPD structure away from the first semiconductor die;
a core structure bonded to the first conductive posts over the first semiconductor die, the core structure including a semiconductor material and conductive TSVs; and
a second semiconductor die mounted over the core structure, the second semiconductor die being electrically connected to the core structure.

20. The semiconductor device of claim 19, wherein the core structure has sufficient area to cover the first conductive posts and the first semiconductor die.

21. The semiconductor device of claim 19, further comprising a first wafer molding compound deposited over the first conductive posts and the first semiconductor die.

22. The semiconductor device of claim 21, further comprising:
a plurality of second conductive posts disposed over the core structure; and
a second wafer molding compound deposited over the second conductive posts and the second semiconductor die.

23. The semiconductor device of claim 22, further comprising a second wafer molding compound deposited over the second conductive posts and the second semiconductor die.

24. The semiconductor device of claim 19, further comprising a carrier disposed below the IPD structure.

* * * * *